(12) United States Patent
Joseph

(10) Patent No.: US 10,630,053 B2
(45) Date of Patent: Apr. 21, 2020

(54) HIGH POWER LASER GRID STRUCTURE

(71) Applicant: OptiPulse Inc., Albuquerque, NM (US)

(72) Inventor: John Richard Joseph, Albuquerque, NM (US)

(73) Assignee: OPTIPULSE INC., Albuquerque, NM (US)

( * ) Notice: Subject to any disclaimer, the term of this patent is extended or adjusted under 35 U.S.C. 154(b) by 0 days.

(21) Appl. No.: 16/102,572

(22) Filed: Aug. 13, 2018

(65) Prior Publication Data

US 2019/0006819 A1    Jan. 3, 2019

Related U.S. Application Data

(63) Continuation-in-part of application No. 16/011,417, filed on Jun. 18, 2018, and a continuation-in-part of
(Continued)

(51) Int. Cl.
*H01S 5/00* (2006.01)
*H01S 5/183* (2006.01)
(Continued)

(52) U.S. Cl.
CPC ........ *H01S 5/18305* (2013.01); *H01S 5/0228* (2013.01); *H01S 5/22* (2013.01);
(Continued)

(58) Field of Classification Search
CPC .. H01S 5/4012; H01S 5/0228; H01S 5/18388; H01S 5/18369; H01S 5/187;
(Continued)

(56) References Cited

U.S. PATENT DOCUMENTS 5,896,408 A    4/1999   Corzine et al.
5,978,408 A   11/1999   Thornton
(Continued)

FOREIGN PATENT DOCUMENTS

CN    1360376 A    7/2002
CN    1732604 A    2/2006
(Continued)

OTHER PUBLICATIONS

Extended European Search Report for EP Application 16831439.1 dated Mar. 2, 2019.
(Continued)

*Primary Examiner* — Kinam Park
(74) *Attorney, Agent, or Firm* — Thompson Coburn LLP

(57) ABSTRACT

Disclosed herein are various embodiments for laser apparatuses. In an example embodiment, the laser apparatus comprises (1) a laser-emitting epitaxial structure having a front and a back, wherein the laser-emitting epitaxial structure is back-emitting and comprises a plurality of laser regions within a single mesa structure, each laser region having an aperture through which laser beams are controllably emitted, (2) a micro-lens array located on the back of the laser-emitting epitaxial structure, wherein each micro-lens of the micro-lens array is aligned with a laser region of the laser-emitting epitaxial structure, and (3) a non-coherent beam combiner positioned to non-coherently combine a plurality of laser beams emitted from the apertures.

40 Claims, 24 Drawing Sheets

Related U.S. Application Data application No. 15/223,712, filed on Jul. 29, 2016, now Pat. No. 10,153,615.

(60) Provisional application No. 62/543,972, filed on Aug. 11, 2017, provisional application No. 62/520,868, filed on Jun. 16, 2017, provisional application No. 62/272,242, filed on Dec. 29, 2015, provisional application No. 62/199,117, filed on Jul. 30, 2015.

(51) Int. Cl.
*H01S 5/22* (2006.01)
*H01S 5/42* (2006.01)
*H01S 5/022* (2006.01)
*H01S 5/40* (2006.01)
*H01S 5/10* (2006.01)
*H01S 5/042* (2006.01)
*H01S 5/20* (2006.01)

(52) U.S. Cl.
CPC ............ *H01S 5/423* (2013.01); *H01S 5/0425* (2013.01); *H01S 5/1021* (2013.01); *H01S 5/1025* (2013.01); *H01S 5/18308* (2013.01); *H01S 5/18341* (2013.01); *H01S 5/18388* (2013.01); *H01S 5/2063* (2013.01); *H01S 5/4012* (2013.01)

(58) Field of Classification Search
CPC .... H01S 5/423; H01S 5/0207; H01S 5/02288; H01S 5/026; H01S 5/0425; H01S 5/18305; H01S 5/18386; H01S 5/4025; H01S 5/42; H01S 5/0267; H01S 5/18391
See application file for complete search history.

(56) References Cited

U.S. PATENT DOCUMENTS

| | | | |
|---|---|---|---|
| 6,016,212 A | 1/2000 | Durant et al. | |
| 6,645,848 B2 | 11/2003 | Joseph et al. | |
| 7,526,206 B1 | 4/2009 | Rolenz | |
| 7,949,024 B2 | 5/2011 | Joseph | |
| 8,076,693 B2 | 12/2011 | Shi | |
| 8,520,713 B2 | 8/2013 | Joseph | |
| 8,613,536 B2 | 12/2013 | Joseph et al. | |
| 8,848,757 B2 | 9/2014 | Joseph | |
| 8,979,338 B2 | 3/2015 | Joseph | |
| 8,995,485 B2 | 3/2015 | Joseph et al. | |
| 8,995,493 B2 | 3/2015 | Joseph et al. | |
| 9,065,239 B2 | 6/2015 | Joseph et al. | |
| 9,599,667 B1 | 3/2017 | Beutler et al. | |
| 9,887,515 B2 | 2/2018 | Furuya | |
| 9,927,558 B2 | 3/2018 | Carson et al. | |
| 9,998,221 B2 | 6/2018 | Boroson et al. | |
| 10,038,304 B2 | 7/2018 | Joseph | |
| 10,153,615 B2 | 12/2018 | Joseph | |
| 2002/0182848 A1 | 12/2002 | Joseph et al. | |
| 2003/0026303 A1 | 2/2003 | Ouchi | |
| 2003/0091084 A1 | 5/2003 | Sun et al. | |
| 2004/0067006 A1 | 4/2004 | Welch et al. | |
| 2004/0090620 A1* | 5/2004 | Farr | G01J 1/4257 356/222 |
| 2004/0190580 A1 | 9/2004 | Pezeshki et al. | |
| 2005/0100070 A1 | 5/2005 | Nakayama et al. | |
| 2006/0023757 A1 | 2/2006 | Mooradian et al. | |
| 2007/0091960 A1 | 4/2007 | Gauggel et al. | |
| 2007/0217473 A1 | 9/2007 | Abe et al. | |
| 2007/0280320 A1 | 12/2007 | Feezell et al. | |
| 2010/0158067 A1 | 6/2010 | Nakatsuka et al. | |
| 2010/0303113 A1 | 12/2010 | Joseph | |
| 2011/0013911 A1 | 1/2011 | Alexander et al. | |
| 2011/0148328 A1* | 6/2011 | Joseph | F21K 9/00 315/312 |
| 2011/0176567 A1 | 7/2011 | Joseph | |
| 2011/0279903 A1 | 11/2011 | Wiedemann et al. | |
| 2012/0128015 A1 | 5/2012 | Joseph | |
| 2013/0027778 A1* | 1/2013 | Currie | G02B 5/205 359/580 |
| 2013/0223466 A1 | 8/2013 | Gronenbom et al. | |
| 2013/0223846 A1 | 8/2013 | Joseph et al. | |
| 2013/0266326 A1 | 10/2013 | Joseph et al. | |
| 2013/0272330 A1 | 10/2013 | Joseph et al. | |
| 2014/0079088 A1* | 3/2014 | Joseph | G02B 27/0905 372/50.12 |
| 2014/0105553 A1* | 4/2014 | Kim | G02F 1/011 385/123 |
| 2014/0199542 A1* | 7/2014 | Li | G02B 1/105 428/336 |
| 2015/0063387 A1 | 3/2015 | Joseph et al. | |
| 2015/0171375 A1* | 6/2015 | Setz | H01L 51/5275 257/40 |
| 2015/0321621 A1* | 11/2015 | Van Dan Elzen | H05K 1/09 348/148 |
| 2015/0340841 A1 | 11/2015 | Joseph | |
| 2016/0080077 A1 | 3/2016 | Joseph et al. | |
| 2016/0170218 A1* | 6/2016 | Johnson | G02B 6/29362 359/356 |
| 2017/0033535 A1 | 2/2017 | Joseph | |
| 2017/0115497 A1 | 4/2017 | Chen et al. | |
| 2017/0299781 A1 | 10/2017 | Carson et al. | |
| 2017/0310072 A1 | 10/2017 | Link et al. | |
| 2018/0172885 A1 | 6/2018 | Carson et al. | |
| 2018/0366907 A1 | 12/2018 | Joseph | |
| 2019/0006819 A1 | 1/2019 | Joseph | |

FOREIGN PATENT DOCUMENTS

| | | |
|---|---|---|
| CN | 102263371 A | 11/2011 |
| CN | 103403986 A | 11/2013 |
| EP | 0898344 A2 | 2/1999 |
| EP | 1501162 A2 | 1/2005 |
| JP | 2016040822 A | 3/2016 |
| WO | 2014018684 A1 | 1/2014 |

OTHER PUBLICATIONS

International Search Report and Written Opinion for PCT/US2016/044813 dated Oct. 18, 2016.
International Search Report and Written Opinion for PCT/US2018/046556 dated Oct. 18, 2018.
Kong et al., "Graphene based Ultra-Thin Flat Lenses", ACS Photonics, 2015, 19 pages.
Prosecution History for U.S. Appl. No. 15/223,712, now U.S. Pat. No. 10,153,615, filed Jul. 29, 2016.
Yoshikawa et al., "High Power VCSEL Devices for Free Space Optical Communications", Proc. of Electronic Components and Technology Conference, 2005, pp. 1353-1358, vol. 2.

* cited by examiner

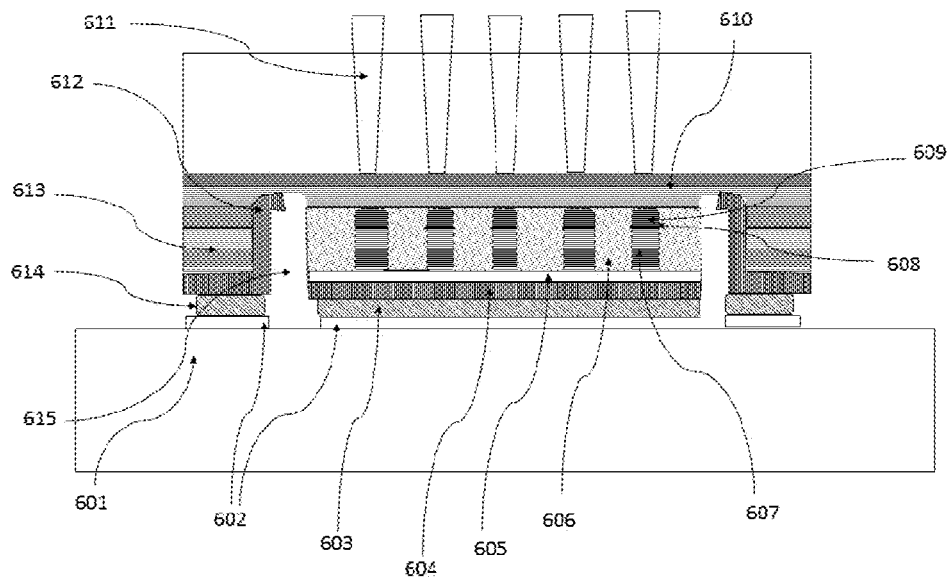
Figure 6
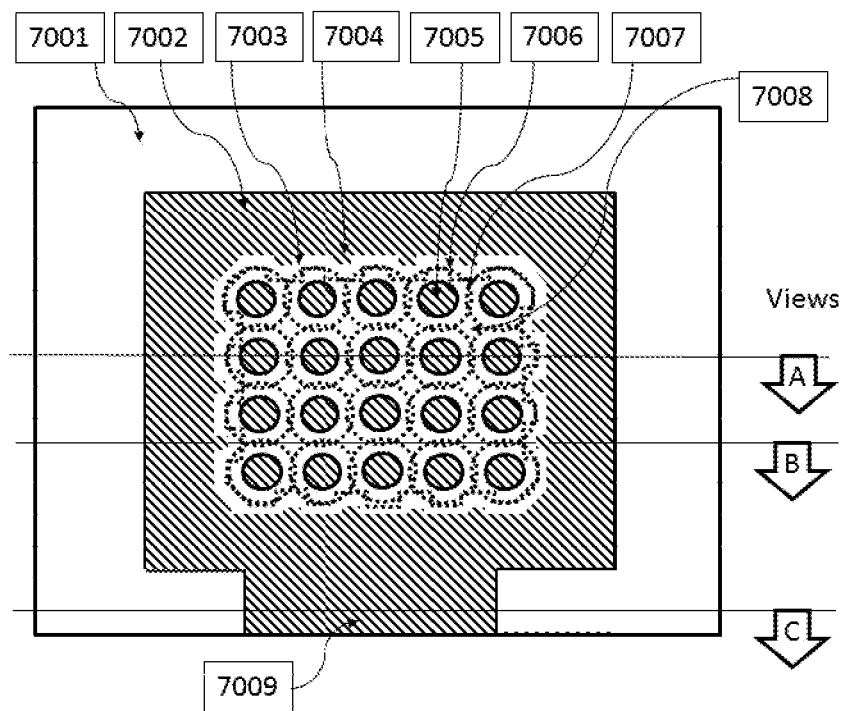
Figure 7 (Top View)

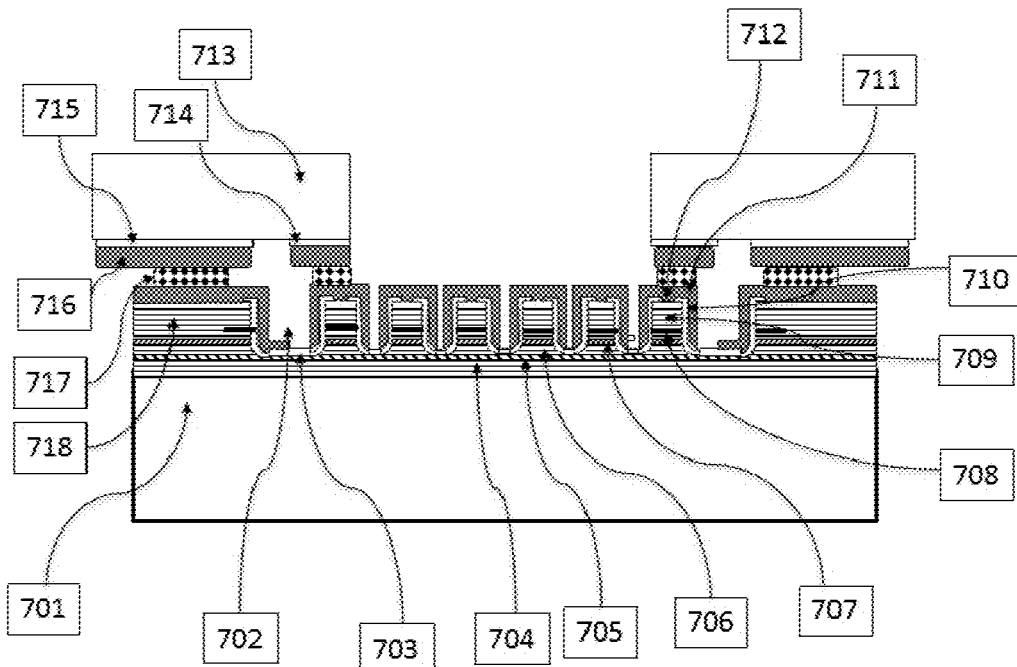
Figure 7A (View A)
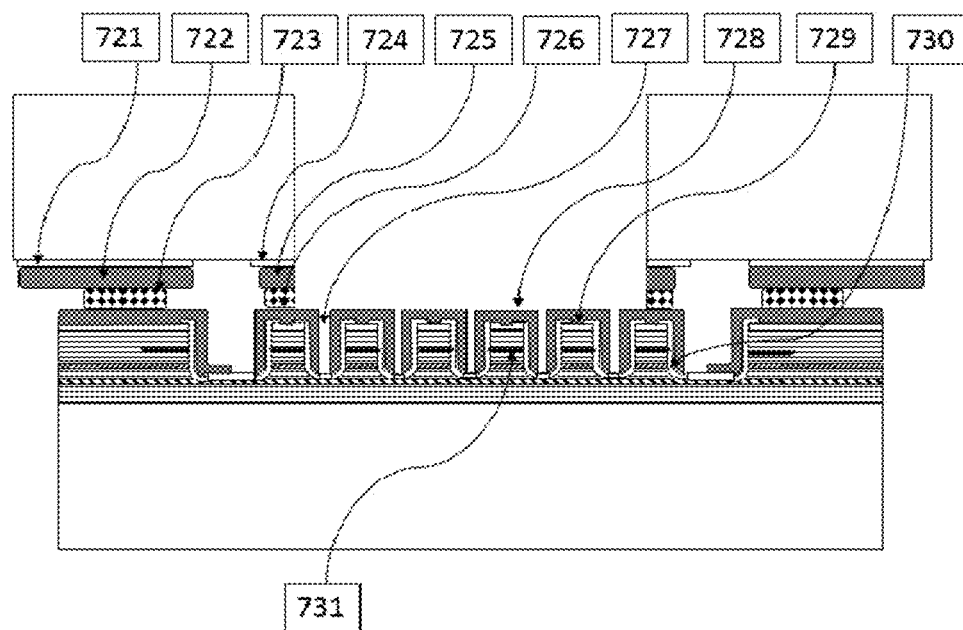
Figure 7A2 (View A)

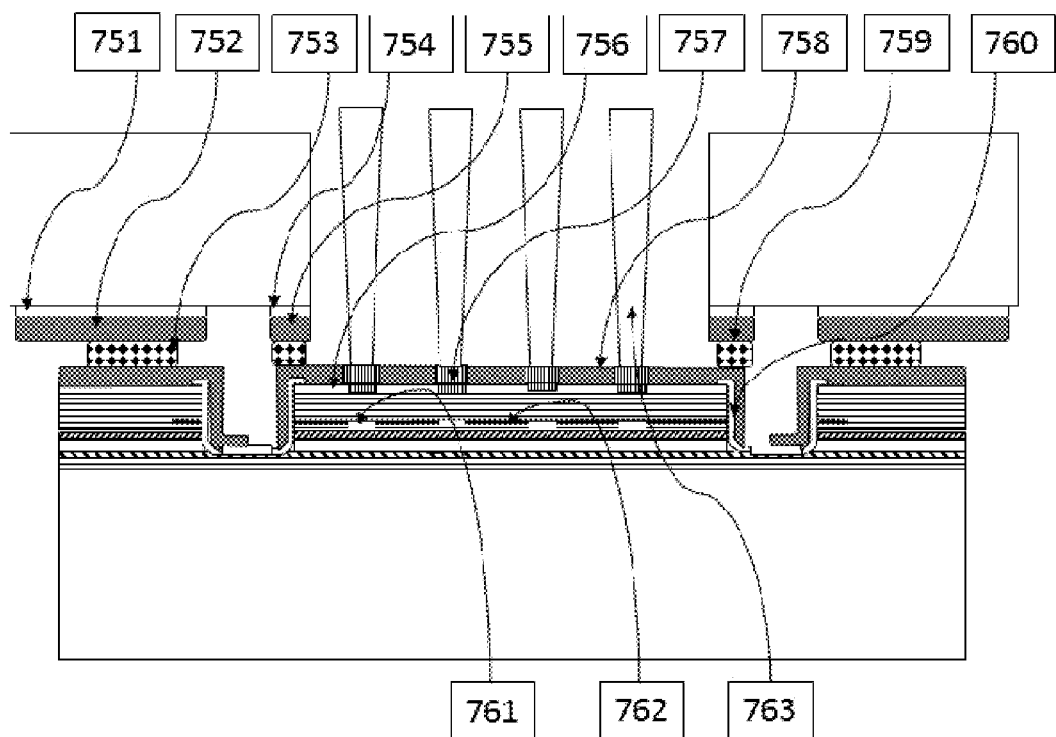
Figure 7B (View B)
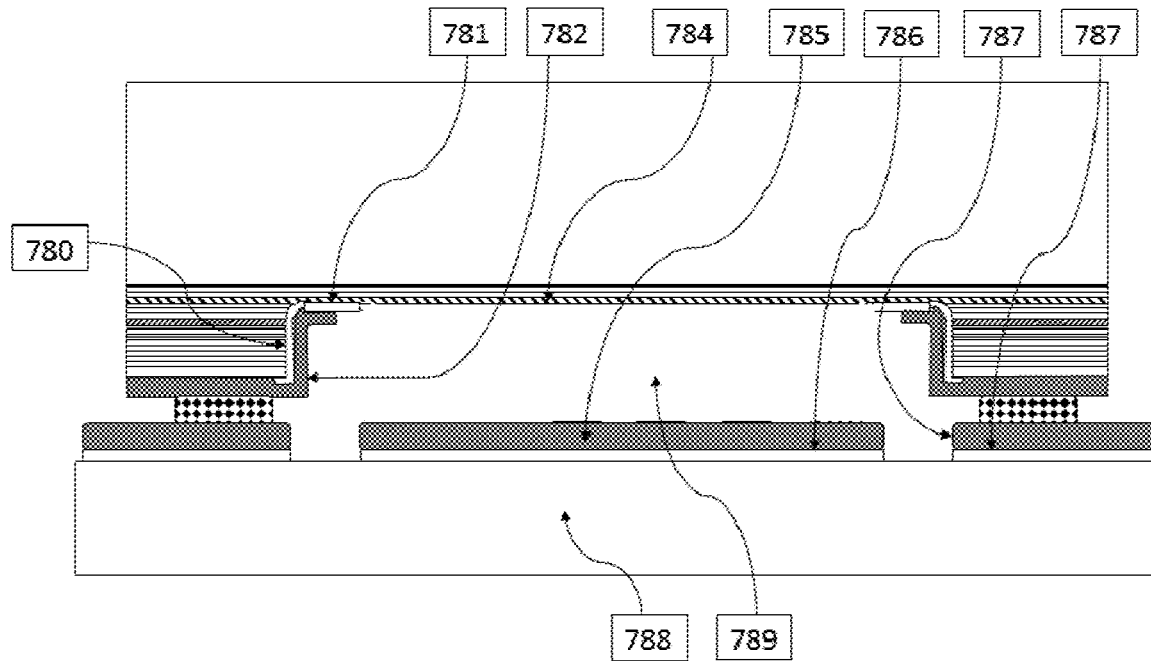
Figure 7C (View C)

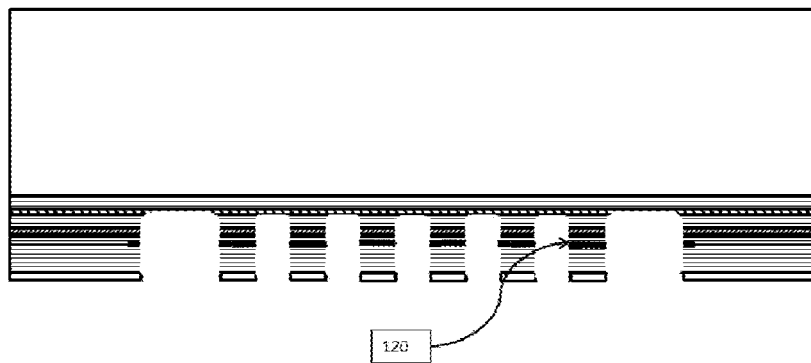
Figure 10A2
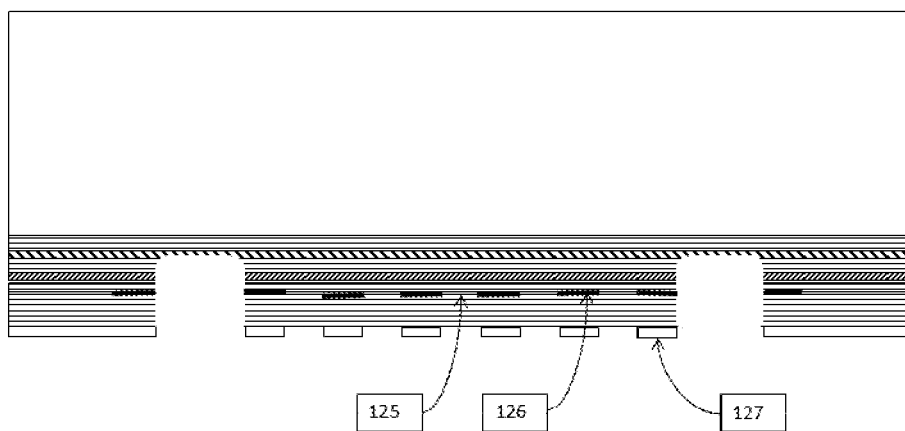
Figure 10B
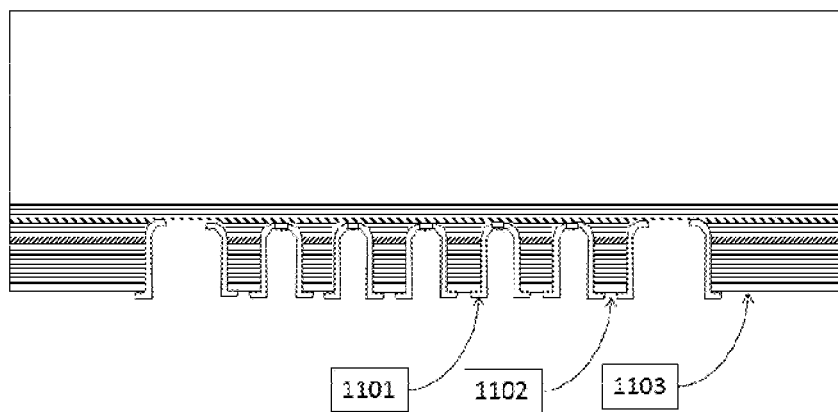
Figure 11

HIGH POWER LASER GRID STRUCTURE

CROSS REFERENCE AND PRIORITY CLAIM TO RELATED PATENT APPLICATIONS

This patent application claims priority to U.S. provisional patent application Ser. No. 62/543,972, filed Aug. 11, 2017, entitled "High Power Laser Grid Structure for Drone Defense", the entire disclosure of which is incorporated herein by reference.

This patent application is also a continuation-in-part of U.S. patent application Ser. No. 16/011,417, filed Jun. 18, 2018, entitled "Graphene Lens Structures for Use with Light Engines and Grid Laser Structures", which claims priority to U.S. provisional patent application Ser. No. 62/520,868, filed Jun. 16, 2017, the entire disclosures of each of which are incorporated herein by reference.

This patent application is also a continuation-in-part of U.S. patent application Ser. No. 15/223,712, filed Jul. 29, 2016, entitled "Rigid High Power and High Speed Lasing Grid Structures", which (1) claims priority to U.S. provisional patent application Ser. No. 62/199,117, filed Jul. 30, 2015, and (2) claims priority to US provisional patent application Ser. No. 62/272,242, filed Dec. 29, 2015, the entire disclosures of each of which are incorporated herein by reference.

INTRODUCTION

Low-cost, highly efficient, and high-power semiconductor lasers are needed in the art for directed-energy applications—for example, for illumination lasers, beacon lasers, or for pumping other lasers. Surface emitting laser devices are especially adaptable to scaling power. Such devices are typically top-emitting or back-emitting emitting where the entire cavity is grown in a sequence of mirrors and active regions. Other designs move one side of the mirrors' completion out at a relatively long distance of mms. External cavity designs for such laser devices have proven difficult to produce in an array configuration due to nonplanar bowing of the chip after bonding, which adversely affects the intra-cavity mirrors and only optimizes a few of the array at a time, thereby reducing consistent results.

As a solution to these problems in the art, the inventors disclose a semiconductor laser structure that offers multiple advantages in overcoming bowing. An example of such a structure can be a back-emitting epitaxial structure that includes a plurality of laser regions within a single mesa structure, each laser region having an aperture through which laser beams are controllably emitted. Each aperture can be part of a laser cavity. Unlike conventional approaches in the art as described above where bowing is a problem, each cavity is not adversely affected because the completion of the mirror stage which is a series of layers with a contrast in the materials refractive index is completed with the mirror or reflective layers on the wafer layer. This consistent distance can be used in conjunction with beam forming optics to optimize output in a larger device aperture (but with more apertures so as to maintain overall output power of the array of Extended Cavity devices). With conventional designs, when a chip is bonded to a substrate, the stresses slightly deform the chip from a flat planar surface to a slightly-bowed surface, making it impossible to align a mirror array that is planar to the chip's surface. The planarity of the cavity is an important alignment feature because it controls the feedback back into the aperture.

With example embodiments described herein, the bowing problems experienced by conventional solutions in the art can be overcome by using the back of the laser substrate as the mounting surface for a micro-lens array; this surface is always planar and perpendicular to all the laser optical axes for the laser regions. While this architecture results in an aperture size that is smaller than conventional designs, this smaller aperture size can be offset by the large number of laser regions and corresponding apertures that can included in the semiconductor laser structure. A non-coherent beam combiner can then be positioned to non-coherently combine the laser beams emitted by these apertures to produce a low coherence length for the overall beam, which is a benefit for illuminator and beacon lasers.

Accordingly, the example embodiments described herein result in a unique design architecture that allows for increased power, while reducing pulse width, size, weight and cost. The technology described herein is thus expected to improve performance by achieving a high-power, short-coherent-length beam with high beam quality suitable for use as an illuminator or beacon laser that can be used for drone defense directed-energy weapons.

These and other features and advantages of the present invention will be described hereinafter to those having ordinary skill in the art.

BRIEF DESCRIPTION OF THE DRAWINGS

FIG. 6 shows a view of an example bottom-emitting implant embodiment.

FIGS. 7 and 7A-7C show views of an example top-emitting oxidation embodiment.

FIGS. 8-14c show various views of an example bottom-emitting oxidation embodiment.

DETAILED DESCRIPTION OF EXAMPLE EMBODIMENTS

Figure 25:
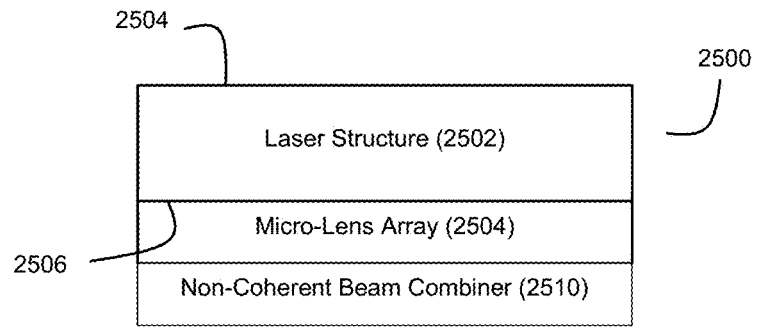
FIG. 25 shows a cross-sectional view of a laser apparatus in accordance with an example embodiment.

FIG. 25 shows a cross-sectional view of an example laser apparatus 2500 that includes a laser structure 2502 in combination with a micro-lens array 2504 and a non-coherent beam combiner 2510. The laser structure 2502 can be a laser-emitting epitaxial structure having a front (or top) 2504 and a back 2506, wherein the laser-emitting epitaxial structure is back-emitting. The laser structure comprises a plurality of laser regions within a single mesa structure, each laser region having an aperture through which laser beams are controllably emitted. As shown by FIG. 25, the micro-lens array 2502 is located on the back 2506 of the laser structure 2502. Each micro-lens of the micro-lens array 2504 is aligned with a laser region of the laser-emitting epitaxial structure 2502. The non-coherent beam combiner 2510 is positioned to non-coherently combine a plurality of laser beams emitted from the apertures.

Examples of devices that can be used as laser structure 2502 are disclosed and described in the above-referenced and incorporated US Pat. App. Pub. 2017/0033535, a copy of which is included herewith as Appendix A. Appendix A describes multi-conductive grid-forming laser structures, which in an example embodiment, can be embodied by a single unit of semiconductor lasers in a mesa structure, and their connections to a high speed electrical waveguide for high frequency operation. Additional examples of devices that can be used as laser structure 2502 are disclosed and described in the following U.S. patent applications, the entire disclosures of each of which are incorporated herein by reference: (1) U.S. patent application 62/456,476, filed Feb. 2, 2017, and entitled "Methods to Advance Light Grid Structures for Low-Cost Laser Sources", (2) U.S. patent application 62/456,489, filed Feb. 2, 2017, and entitled "Fabrication of Light Grid Structures with Wafer Scale Processing", (3) U.S. patent application 62/456,501, filed Feb. 2, 2017, and entitled "High Power Laser Grid Structure for Applications over Distance", (4) U.S. patent application 62/456,518, filed Feb. 2, 2017, and entitled "Methods for Advancing High Brightness Diodes", and (5) U.S. patent application 62/459,061, filed Feb. 15, 2017, and entitled "Rigid Lasing Grid Structure Array Configured to Scan, Communicate, and Process Materials Using Deformable Light Fields".

Also, the laser structure 2502 can be arranged as an array of multiple laser-emitting epitaxial structures, each laser-emitting epitaxial structure having a single mesa structure, where the single mesa structure includes multiple isolated laser regions. In such an array, the laser structure 2502 may have multiple mesa structures, where each mesa structure includes multiple isolated laser regions. Such a laser grid structure can exhibit high numbers of laser emitters on a small chip.

Figure 26:
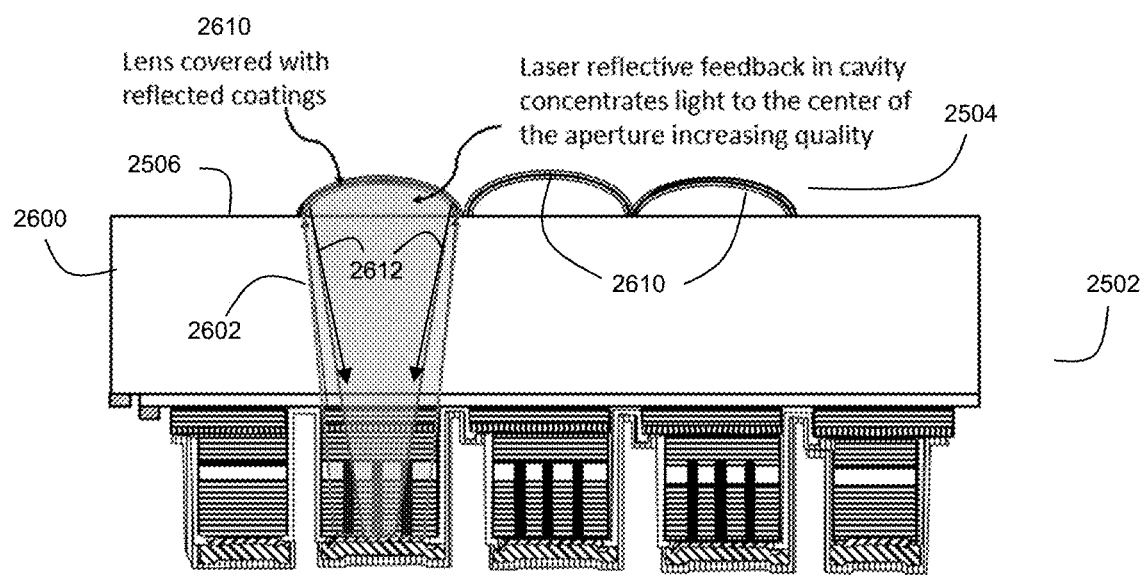
FIG. 26 shows a cross-sectional view of an example extended cavity showing a lens that is positioned on the backside of the laser wafer, where the lens includes a dielectric coating which acts as a mirror.

As an example embodiment, the laser apparatus 2500 can be used in beacon illuminator lasers. In this technology, the laser cavity can be extended to the back of the wafer to eliminate external alignment of optical components, as shown by FIG. 26. This design approach can drastically improve beam quality ($M^2$ of <1.5). Also, the beam coherence length can be reduced to below 1 mm by using multiple low coherence beams with high quality beam characteristics in a non-coherent beam-forming architecture, defined by the individual beams' characteristic.

The method of making the combination of laser structure 2502 with micro-lens array 2504 involves 2D photolithography techniques, which enable the deployment of tens of thousands of chips on a single 4" wafer (see substrate 2600 in FIG. 26) while also eliminating chip-scale complexities. Examples of extended cavity devices have produced $M^2$ values<1.5. In effect, this wafer-level process will eliminate thousands of hours of adjustments in alignment in a single wafer with a single process, while improving output power and reliability.

As shown in FIG. 26, the micro-lens array can comprise multiple curved lenses 2610, each with a smooth radius of curvature. The lens array can be etched into the surface of the back of the laser substrate opposite the back-emitting epitaxial growth side. Etching an array of lenses occurs when one first patterns with a thin photoresist and heat it above the glass transition state when the photoresist melts and forms a lens type structure due to surface tension. The lens type structure can then be a mask to etch that structure into the GaAs laser wafer surface. The Radius of Curvature (ROC) of the lens can be controlled by adjusting the selectivity between the BCl3 or Cl containing removal of GaAs as compared to the resist removal rate. This can be accomplished by adding O2 to the plasma or other methods. A graphene lens could be substituted for the etched lens in making arrays of lens on the back of the chip as discussed below, or if it is used as the beam forming array they could be formed on an external clear or transparent substrate as a microlens array.

Each lens 2610 can be aligned with a laser cavity 2602 in the substrate 2600 that terminates in an aperture at the back 2506 of the substrate 2600. While only one such cavity 2602 is shown by FIG. 26 for ease of illustration, it should be understood that each of the lenses 2610 can be aligned with a different laser cavity 2602. Each cavity 2602 exhibits an optical axis that corresponds to a direction of beam emissions through the aperture (e.g., a vertical axis with reference to the arrangement of FIG. 26).

The lenses 2610 can be covered with a reflective coating such as a reflective dielectric so that they serve as mirrors for some of the light emitted out of the laser cavities 2602. As shown by FIG. 26, the lenses 2610 can be curved in a manner to provide a feedback mechanism that concentrates light to the center of the cavity 2602 to increase beam quality and beam output.

Thus, this reflected light in turn gets channeled within the cavity 2602 to create a greater concentration of light energy in beam emitting along the central optical axis of the cavity 2602. By lengthening the cavity 2602, stabilization and a better quality of beam output can be achieved.

Degradations in beam quality produced as a result of laser feedback into the cavity 2602 can be mitigated by matching the cavity 2602 with the correctly-modeled micro-lens radius of curvature. If the feedback spot is optimized to match the area into the current confinement region of the laser it can optimize power out by not overfilling or underfilling the active region of the laser where the current produce the photons. Furthermore, epitaxial design may also require more growth runs to optimize reflectance in the epitaxial output mirror. Output power is a function of reflectivity of the output mirror. The more reflective the mirror, the lower the number of photons will exit and the higher number of photons will reflect back into the cavity. Adjusting the reflectivities of the output cavity helps to optimize power out. Reflectivity can be adjusted by modification in the epitaxial layers or by adjusting the completion layers of the mirror which are deposited on the surface of the microlens etched array.

An example of wafer-scale photolithography techniques that can be used for creating these lenses 2610 is described below with reference to FIGS. 30-34. With such wafer-scale photolithography, hundreds of thousands of lenses can be aligned and formed at the same time.

Figure 27:
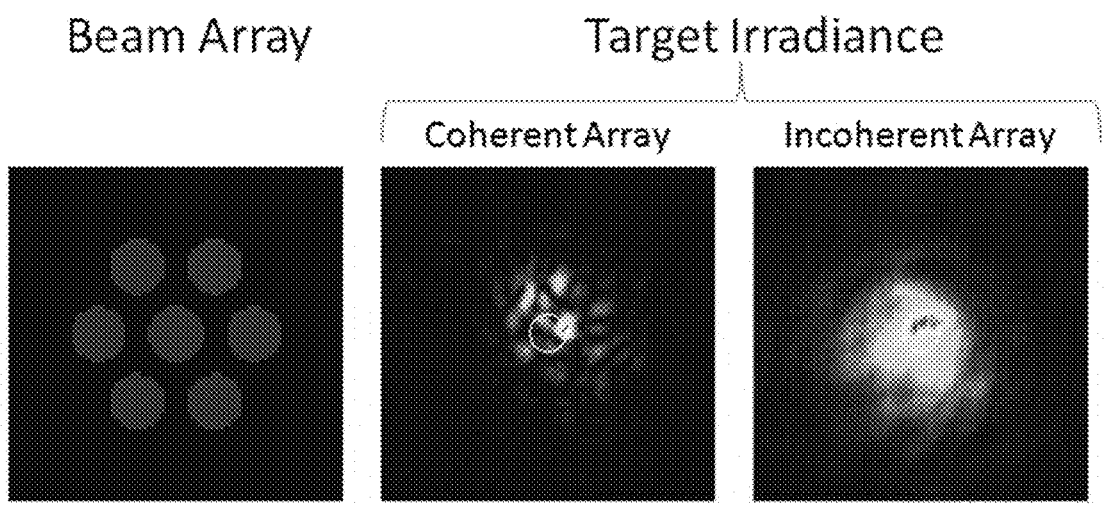
FIG. 27 shows simulation results for an example embodiment.

Compared to beams from coherent arrays, beams from incoherent arrays such as that shown by FIGS. 25 and 26 have short coherence length and produce less speckle on target. It is believed that the coherence length for the array of FIGS. 25 and 26 can be less than 1 mm. All low-coherence arrays tested have shown a linear relationship with power out as lasers are added. 100 lasers, each with an output of 1 mW will produce 100 mW of power, or 1 million lasers of 0.1 W each will produce 100,000 Watts of optical power. A coherent structure has more scintillation in the far field. FIG. 27 shows the results of a simulation using a wave-optics beam propagator with respect to an example embodiment in accordance with FIG. 26. A hexagonal array of top-hat beams is propagated through one instantiation of turbulence with and without mutual coherence. The white circle in each target irradiance frame indicates the target spot. As noted above, the incoherent array is simulated as producing less speckle on the target spot.

The arrangement of FIGS. 25-26 also enables new types of beam combining. In an example embodiment, the non-coherent beam combiner 2510 can take the form of additional lens element such as a microlens that is external to the laser structure 2502 and micro-lens array 2504. Beams will be exiting the micro-lens array 2504 pointed straight ahead, and the beam combiner 2510 operates to bend in the edges of the beams such that all beams converge because of an offset different of the laser pitch to the lens pitch. Accordingly, the beam combiner 2510 directs the beams to a single spot in front of the 2D array. The non-coherent beam combiner 2510 can employ 2D-beam-combining with an overlapping convergence point. However, it should be understood that beam combiner 2510 can also employ 3D-beam-combining with overlapping multiple convergence points.

Figure 28:
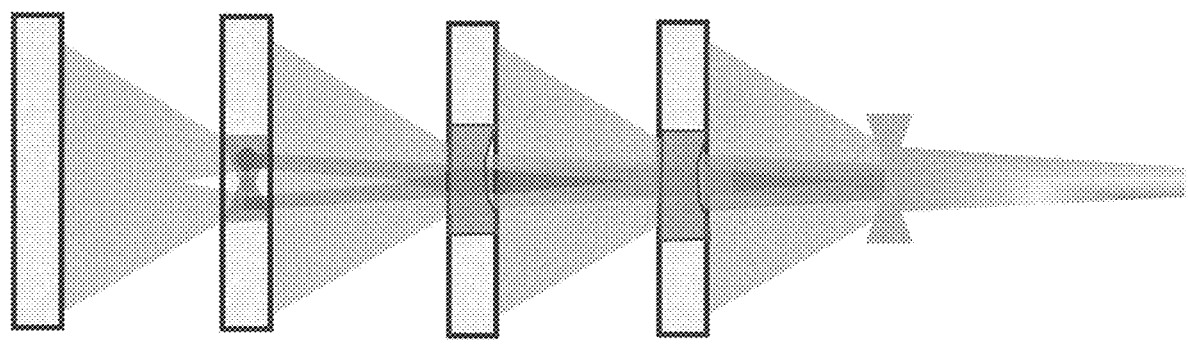
FIG. 28 shows an example flexible beam-combining technique that can be used with example embodiments of the laser apparatus.
Figure 29:
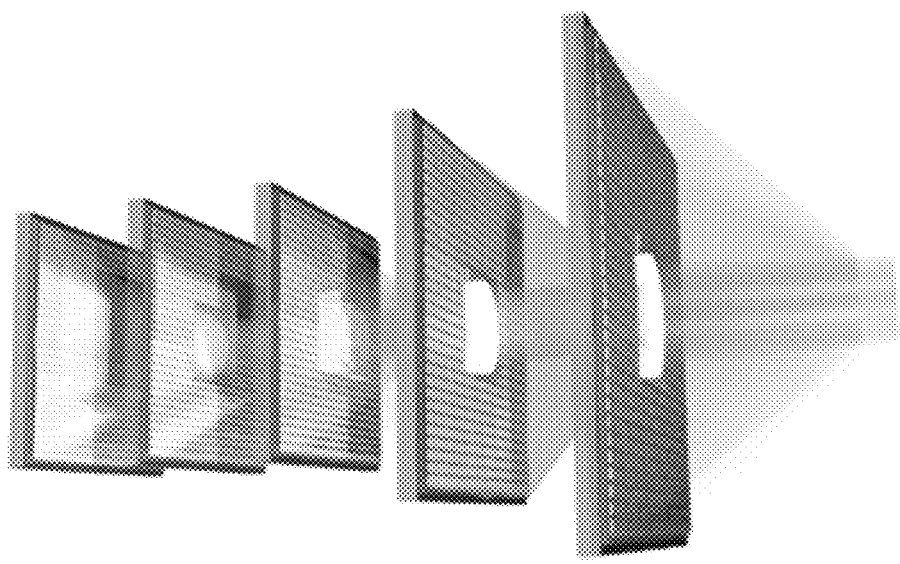
FIG. 29 shows a perspective view of the flexible beam-combining technique of FIG. 28.

FIG. 28 shows an example flexible beam-combining technique that can be used with example embodiments of the laser apparatus 2500. In FIG. 28, a bottom layer in the array stack can be a full laser grid array, while upper layers in the stack can include an opening in the laser grid array (e.g., a central hole as shown by FIG. 28). The micro-lens array 2504 in the upper stacks can employ torus-shaped lenses. A series of these torus-shaped lenses on a series of laser grid arrays in accordance with FIG. 26 are arranged in the Z-axis which have the same vertex for both cones of light generated by the torus-shaped lens. The cones go through the torus lens in front of it without interference by the lens. Each system of torus lenses and light grids can be assembled to have multiple cones that generate immense power on the same spot or vertex of all cones. FIG. 29 shows a perspective view of the beam combining shown by FIG. 28.

Accordingly, FIGS. 25-29 describe an example embodiment for a light grid structure which can exhibit high-speed (in excess of 1 GHz on/off rates) and high-power outputs from VCSEL semiconductor laser arrays, The light grid structure is easy to produce at higher yields due to the architectural array designs discussed herein. This device uses a simplified manufacturing design and process to achieve improved performance for speed and power from an all-semiconductor laser chip which uses wafer-scale processes to eliminate complex assembly tasks. The results achieve miniaturization, reduction in cost, and increase in the flexibility of beam characteristics using the manufacturing process instead of expensive and complex alignment with external micro lens/mirror arrays. As such, the present technology will advance automated fabrication of high-beam-quality, high-power, short-coherence-length semiconductor laser arrays that could be used for applications such as drone defense-directed-energy weapons.

Figure 30:
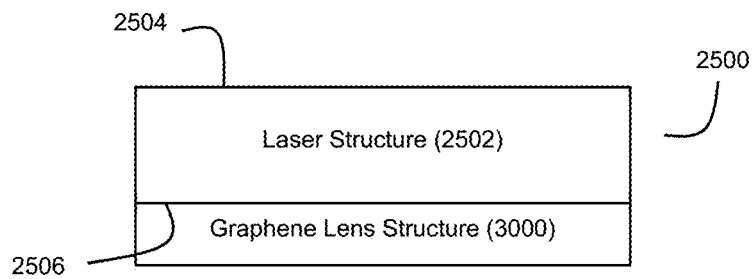
FIG. 30 shows a cross-sectional view of an example laser apparatus that includes a laser structure in combination with a graphene lens structure.

FIG. 30 shows a cross-sectional view of an example laser apparatus 2500 where the micro-lens array takes the form of a graphene lens structure 3000. The graphene lens structure 3000 can be a single graphene lens structure or an array of graphene lens structures.

Figure 31:
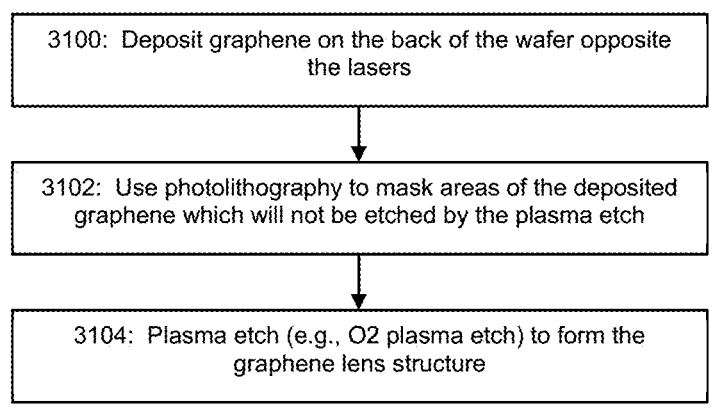
FIG. 31 discloses an example process that can be used to form the graphene lens structure.
Figure 32:
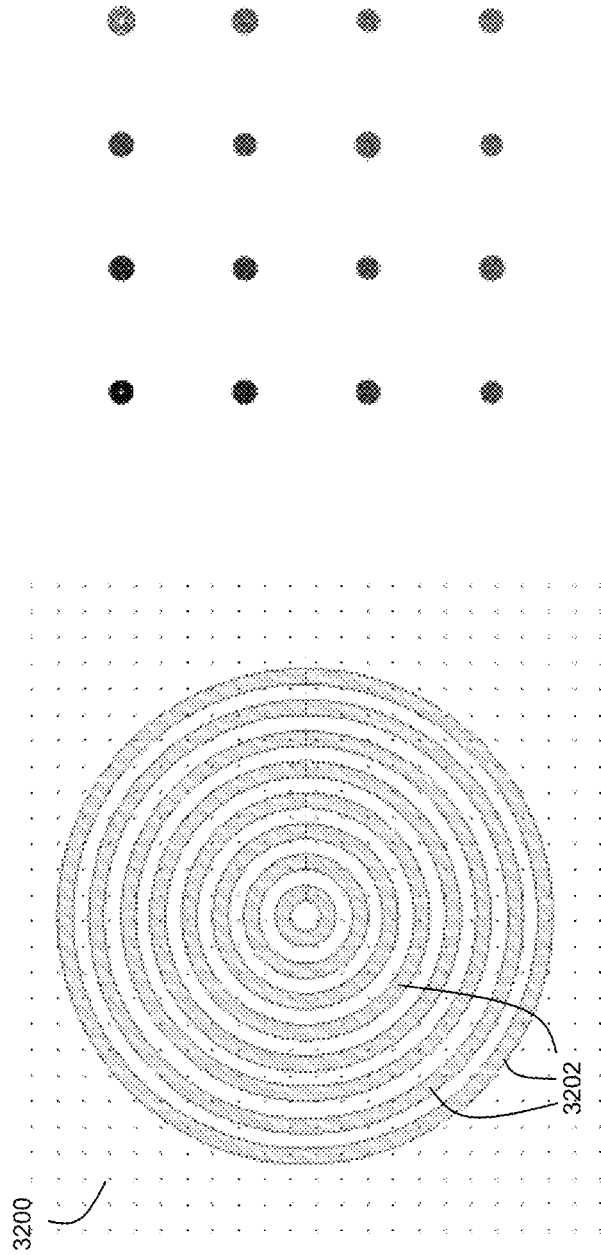
FIG. 32 shows an example where the graphene lens structure can be designed to vary in terms of width and spacing.
Figure 33:
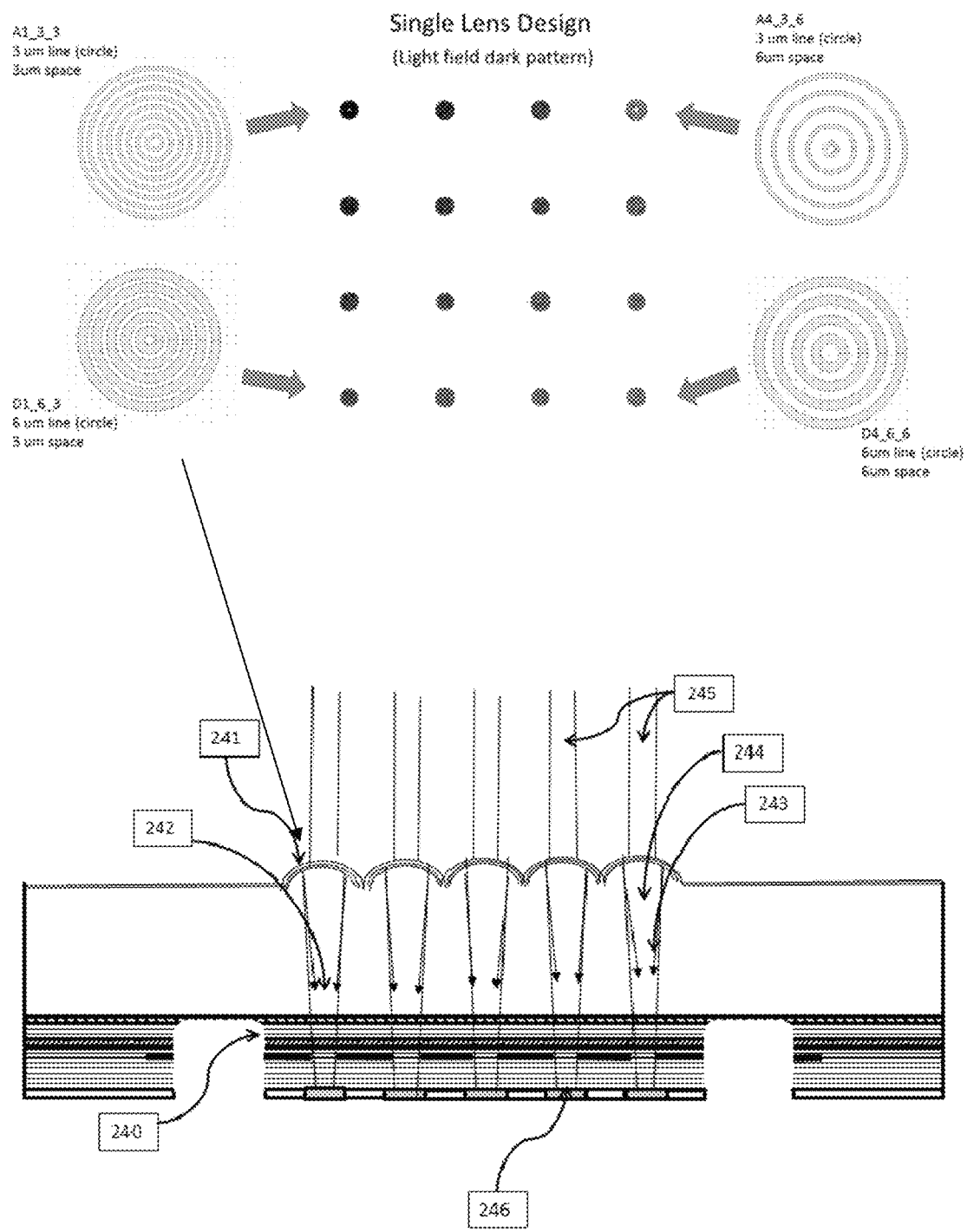
FIG. 33 shows an example graphene lens design that can replace the formed lens in extended cavity designs for the laser structure.
Figure 34:
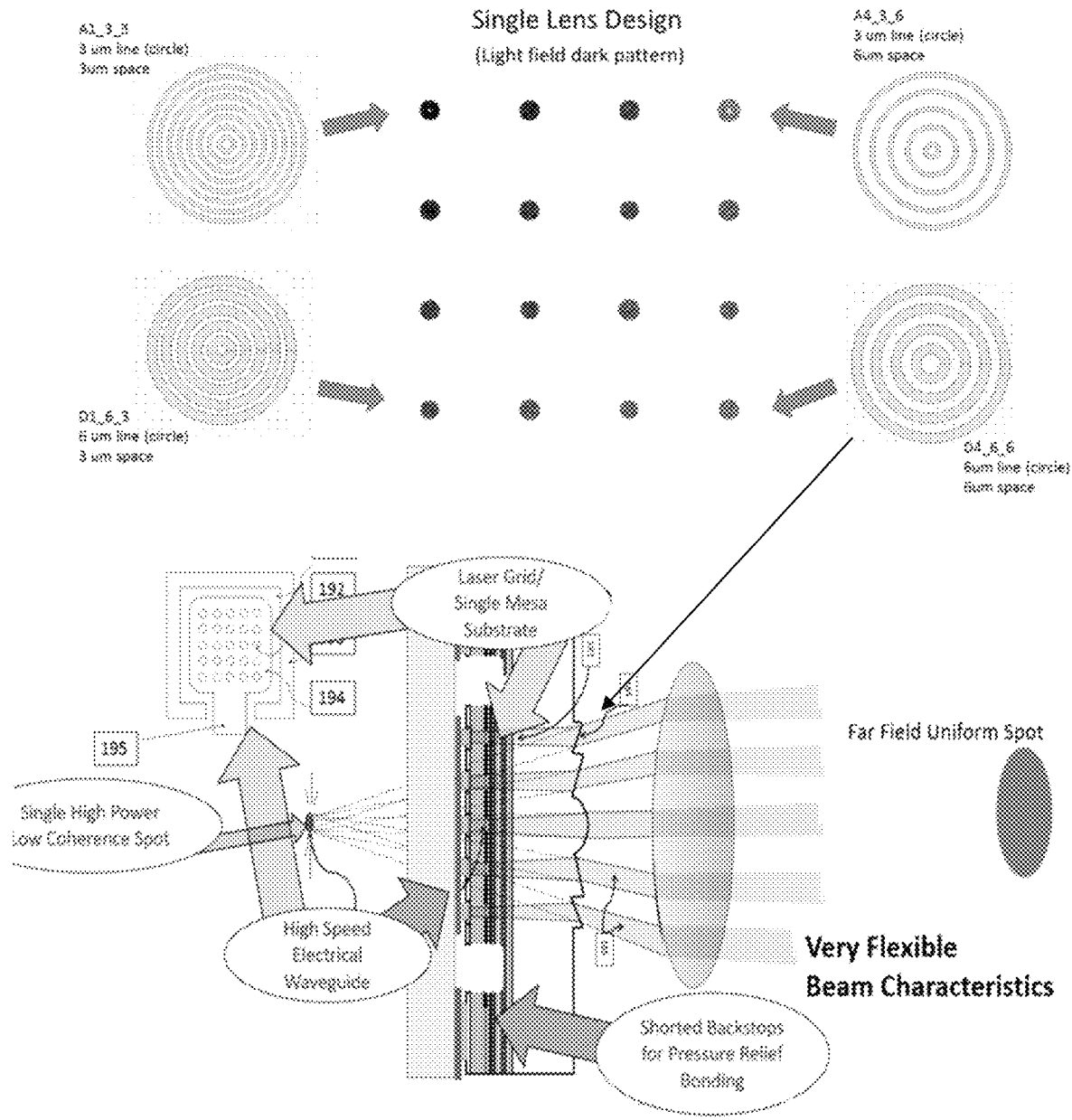
FIG. 34 shows an example graphene lens design that can replace a diffractive optical element (DOE) in the laser structure.

FIG. 31 discloses an example process that can be used to form the graphene lens structure 3000. At step 3100, graphene is deposited on the back 2506 of the laser structure 2502 (e.g., a back-emitting multi-conductive grid-forming laser structure such as examples described below in Appendix A). At step 3102, photolithography is used to mask areas of the deposited graphene. These masked areas will not be plasma etched. FIGS. 32-34 show examples of mask patterns that can be used as this step. Then, at step 3104, the graphene lens structure 3000 is formed by plasma etching the deposited graphene so that the masked areas are not plasma etched. As an example, O2 plasma etching can be performed. This yields a photolithographic lens structure that can be used as the graphene lens structure 3000 in apparatus 2500. This innovative process uses the unique high contrast index of refraction difference between the two materials graphene and a semiconductor such as GaAs to index guide or direct the light formed by the laser structure 2500.

FIG. 32 shows an example where the graphene lens structure 3200 can be designed to vary in terms of width and spacing. In this example, the graphene lens structure 3200 comprises a plurality of concentric graphene rings 3202. The width of the graphene rings 3202 and the spacing between the graphene rings 3202 can be controlled and defined during the masking process to achieve a desired optical effect for the graphene lens structure 3200. Also, the example of FIG. 32 shows an example 4×4 matrix mask for a unique array of 16 lenses—where 2 masks can be employed for a light field and a dark field.

FIG. 33 shows an example graphene lens design that can replace the formed lens in extended cavity designs for the laser structure 2500. The upper part of FIG. 33 shows different examples of width and spacing properties that can be used for the graphene lens structure, and the lower part of FIG. 33 shows the example VCSEL laser structure corresponding to FIG. 21 of Appendix A. The graphene lens structure can replace the formed lens described in Appendix A in connection with FIG. 21 to improve the design. Furthermore, a reflective coating can be deposited over a surface of the graphene lens structure(s).

FIG. 34 shows an example graphene lens design that can replace a diffractive optical element (DOE) in the laser structure 2500. The upper part of FIG. 34 shows different examples of width and spacing properties that can be used for the graphene lens structure, and the lower part of FIG. 34 shows an example laser structure corresponding to FIG. 18 of Appendix A (see also the above-referenced and incorporated 62/456,476, 62/456,489, 62/456,501, 62/456,518, and 62/459,061 patent applications). The graphene lens structure can replace the DOE described in various embodiments of Appendix A to improve the design. As shown by FIG. 34, the graphene lens structure can be used with the laser structure to direct the laser light in a manner that makes the laser light appear as if originating from a single source.

While the present invention has been described above in relation to example embodiments, various modifications may be made thereto that still fall within the invention's scope, as would be recognized by those of ordinary skill in the art. Such modifications to the invention will be recognizable upon review of the teachings herein. As such, the full scope of the present invention is to be defined solely by the appended claims and their legal equivalents.

Appendix A—US Pat App Pub 2017/0033535:

Laser arrays are becoming important in the field of communications, light detection and ranging (LiDaR), and materials processing because of their higher operational optical power and high frequency operation as compared to single lasers, fiber lasers, diode pumped solid state (DPSS) lasers, and light emitting diodes (LEDs).

Laser arrays are commonly used in printing and communications, but in configurations which have a single separate connection to each laser device in the array for parallel communication where each laser could have a separate signal because it had a separate contact from the other devices in the array.

When array elements were tied together and driven with a single signal, the structures had too much capacitance or inductance. This high capacitance/inductance characteristic slowed the frequency response for the laser array down, thereby making such laser arrays slower as they added more elements. This is evidenced in the referenced works by Yoshikawa et al., "High Power VCSEL Devices for Free Space Optical Communications", Proc. of Electronic Components and Technology Conference, 2005, pp. 1353-58 Vol. 2, and U.S. Pat. No. 5,978,408.

High speed laser arrays based on multi-mesa structures are described in the inventor's previous work, US Pat App. Pub. 2011/0176567. US Pat App. Pub. 2011/0176567 describes a multi-mesa array of semiconductor lasers and their connections to a high speed electrical waveguide for high frequency operation. However, the multi-mesa structures described in US Pat App. Pub. 2011/0176567 suffers from a number of shortcomings.

One problem with mesa structures as described in US Pat App. Pub. 2011/0176567 is they are typically brittle. This is a problem if there is any mechanical procedure to bond to or touch the laser after the mesa is formed. The mesas structures can be as small as 5 to 10 microns in diameter and consist of an extremely fragile material such as GaAs or AlGas, or other similar crystalline materials. These mesas must be bonded after processing and pressure is applied under heat so that the submount and the tops of the laser mesas are bonded electrically with solder. When bonding an array of back emitting devices a typical failure mechanism at bonding is a cracked mesa which renders the laser useless and can cause a rejection of the entire device. If there are 30 lasers on the chip and after bonding 2 are broken, those 2 devices will not light up. The testing still must be done causing an expensive process to remove failures.

Another problem is that the multi-mesa structure yields relatively low lasing power as a function of chip real estate because of spacing requirements for the multiple mesas that are present on the laser chip.

Another problem with the multiple mesa arrays produced by mesa isolation is that the lasers are separated by a distance which limits the overall size of the array due to frequency response-dependent design parameters that prefer shorter distance for a signal to travel across a contact pad. Later, arrays were used with elements which add in power such as the multi Vertical Cavity Surface Emitting Laser (VCSEL) arrays which were used for infrared (IR) illumination. However these IR sources did not support high frequency operation, so their pulse width was limited to illumination instead of LIDAR, which needs fast pulse widths.

In an effort to satisfy needs in the art for stronger and more powerful high speed laser arrays, the inventor discloses a number of inventive embodiments herein. For example, embodiments of the invention described below incorporate a high frequency electrical waveguide to connect lasers of the array together while reducing capacitance by forming the signal pad on the substrate which employs the electrical waveguide. Embodiments of the invention also comprise the use of multi-conductive current confinement techniques in a single structure to produce multiple areas that are conducting compared to non-conducting part of the structures. The conducting parts form lasing areas or grids of lasing forming lasers without etching around the entire structure of the lasing point. Unlike the design described in the above-referenced U.S. Pat. No. 5,978,408, embodiments of the invention disclosed herein are designed and processed so that the laser array is integrated with a high speed electrical waveguide to enable high frequency operation. Embodiments of the present invention support new and unique opportunities in the design of a high power high speed light sources by exhibiting both high frequency operation and a rigid structure, thus enhancing performance and reliability over other designs known in the art.

In an example embodiment disclosed herein, a unique structure processed from a Vertical Cavity Surface Emitting Laser (VCSEL) epitaxial material forms a grid of laser points from a single rigid structure which is conducive to high speed operation by reducing capacitance, increasing structural integrity, and decreasing the fill factor as compared to the typical mesa structures formed in VCSEL arrays such as those mentioned in US Pat App. Pub. 2011/0176567. It should be understood that the VCSEL embodiment is only an example, and such a design can work with other laser types, such as Resonant Cavity Light Emitting Diodes (RCLEDs), LEDs, or Vertical Extended (or External) Cavity Surface Emitting Lasers (VECSELs).

The single contiguous structure described herein forms areas of electrical isolation of apertures using implanting of ions or areas of nonconductive oxidation through microstructures or holes while keeping the structural integrity of the material that is typically etched away. The formation of the new structure also allows a high speed signal to be distributed between the different isolated laser conduction points or grid. All of the P-contact areas of the laser grid can be connected in parallel to the signal portion of a ground-signal-ground (GSG) integrated electrical waveguide. The signal or current being switched on and off in the waveguide is distributed between all of the conductive paths which form lasers. It should be understood that other types of electrical waveguides could be used such as a micro-strip waveguide.

The single contiguous structure has other benefits such as a larger base for heat distribution within a larger plating structure. The lasing grid is closer together than the array structures to each other. The farther the lasers are apart the slower the frequency response or the speed which limits the ultimate bandwidth of the device due to the distance the signal must travel to every single point in an array.

Accordingly, examples of advantages that arise from embodiments of the invention include:
1. Rigid structure has a higher reliability in the chip bonding process
2. Rigid structure has a higher fill factor possibility
3. Rigid structure has higher reliability metal contacts
4. Rigid structure is simpler to process
5. Rigid structure has shorter distance between contacts enabling higher frequency high power beams
6. Rigid structure is a better surface topology for a single lens or lens array to be attached
7. Rigid mesa structure produces another area for leads and contacts which offer separation from potentials lowering capacitance.
8. Rigid structures allow higher integration with sub mounts because of the 3D nature of the contacts.

Furthermore, with an example embodiment, a laser grid is formed by more than one lasing area enabled by confining the current to isolated regions in the structure where conductivity exists as compared to the nonconductive ion implanted areas. The conductive and nonconductive areas form a grid of light which has a single metal contact on the single solid structure for the active Positive contact and a single N Contact on the surrounding ground structure which is shorted to the N contact area at the bottom of the trench isolating the two areas. By way of example, FIG. 7C shows how an opening in the frame would help increase the speed.

These P and N contacts are then bonded to a high speed electrical contact The 2 substrate and laser chips are aligned by a bonder then heat and pressure are applied to bond the solder that has been deposited on one chip or the other. The high speed is enabled because the p pad is separated from the n wafer ground by plating and solder heights but mostly by removing it off the laser substrate and placing it on an electrical waveguide substrate. The physical separations dramatically reduces capacitance increasing the frequency response which is limited by the capacitance of the circuit. This enables the lasing grid to achieve high frequency operation.

A single lens formed on the back of the substrate or a single Lens attached or bonded to the back of the grid structure could direct each lasing point from a convergence point or to a convergence point. This is ideal in collimating the beam output as if it were from a single source.

These and other features and advantages of the present invention will be described hereinafter to those having ordinary skill in the art.

Embodiment 1 for US Pat App Pub 2017/0033535—Top-Emitting Implant

Figure 1:
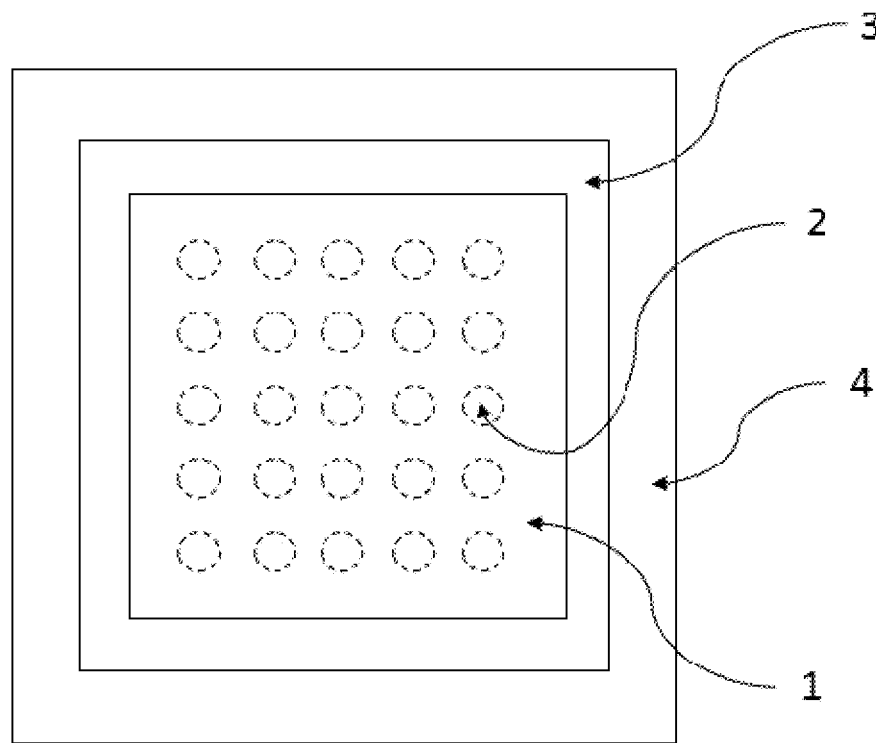
FIGS. 1-5 show various views of an example top-emitting implant embodiment.

FIG. 1 shows an example of a first embodiment of the invention. In this example, a single solid structure is isolated from a surrounding ground with an etch, and where the single solid structure has within it ion implants. The ion implants create areas of the semiconductor material that are non-conductive, and these areas of non-conductivity force current flow through the lasing areas 2. Thus, the ion implants form a laser grid of multiple lasing areas 2 where current is confined to isolated regions in the structure where conductivity exists as compared to the nonconductive ion-implanted areas. The conductive and nonconductive areas form a grid of light which has a single metal contact on the single solid structure for the active positive (P) contact and a single negative (N) contact on the surrounding ground structure which is shorted to the N contact area at the bottom of the trench isolating the two areas or to negative metal on the surrounding ground structure which is shorted to the N contact area at the bottom of the trench isolating the two areas (as in, for example, FIG. 7C (see reference numbers 781 and 782). These P and N contacts are then bonded to a high speed electrical contact, thereby enabling the lasing grid to achieve high frequency operation.

Figure 23:
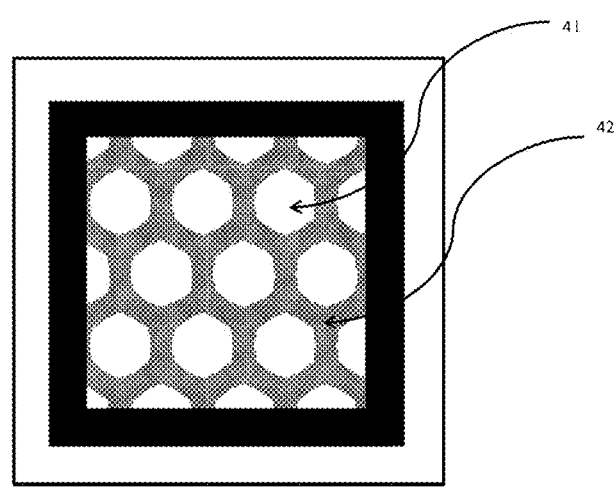
FIG. 23 shows an example of an additional pattern for a lasing grid with respect to various embodiments.

While FIG. 1 shows the lasing areas 2 arranged in a grid pattern, it should be understood that many shapes and patterns of lasing areas 2 could be formed. This allows many forms of structures with shapes/patterns of lasing areas 2 such as a honeycomb structure pattern (see, for example, FIG. 23 which illustrates another pattern which is one of many allowing different laser shapes or patterns; there are many patterns that can be used for etching or implanting to leave conductive areas 41 for lasers in a single mesa structure versus non-conductive areas 42) and other structure patterns which are more rigid while improving bonding. Heat removal can still be accomplished by depositing materials with high thermal conductivity materials in the holes that are etched into the single mesa structure to produce the multiple lasers (see, e.g., holes 7005 in FIG. 7) which are closer to the junctions. Examples of additional structure patterns can include arrangements like squares or circles on lines, etc.

FIG. 1 shows a top view of the epitaxial side of a laser chip. A single laser-emitting epitaxial structure 1 has an ion-implanted area, all except the lasing areas 2 (which are shown as disks in FIG. 1) where the ion implant was masked. FIG. 1 thus represents the chip after implant, and etch. Relative to the prior design of US Pat App Pub 2011/0176567 which has multiple epitaxial mesas with each mesa corresponding to a single lasing region, the design of FIG. 1 shows a single contiguous structure 1 that does not have multiple mesas and can instead be characterized as a single mesa, where this single mesa includes multiple lasing regions 2. The illustration of FIG. 1 is meant to show the single mesa structure and not the electrical contacts. This structure 1 could be either bottom emitting or top emitting depending on the design and reflectance on the N mirror as compared to the P mirror.

Figure 2:
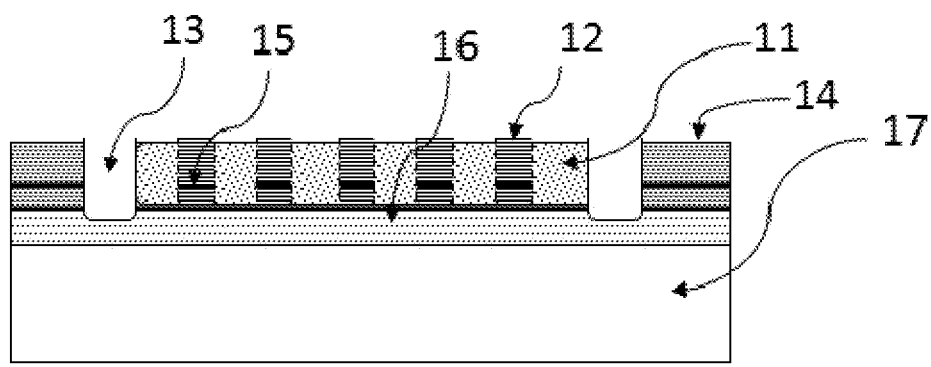
Figure 3:
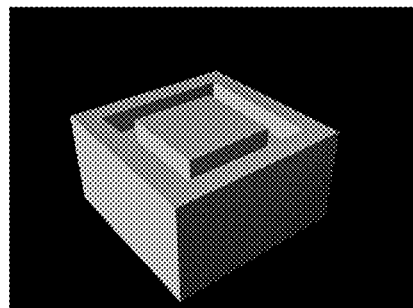

FIG. 1 shows:
  1 Single Active Mesa Structure which will produce multiple lasing points
  2 Areas where implant is masked so that implant does not affect epitaxial region under mask.
  3 Etched isolation trench separating the Single Active Mesa Structure and the Single Ground Structure
  4 Single Ground Structure FIG. 2 is a cutaway view of the laser chip shown by FIG. 1, where the single active mesa structure 1 shown by FIG. 1 is numbered as 11 in FIG. 2 and where the masked implant areas 2 shown by FIG. 1 are numbered as 12 in FIG. 2. FIG. 2 represents the chip after implant, and etch but no top metal. Etched region 13 isolates the single mesa structure 12 from the "frame" or N mesa 14 (where the single ground structure 4 from FIG. 1 is shown as the frame/N mesa 14 in FIG. 2). FIG. 2 shows:

11 Implanted area of Single Active Mesa Structure isolating multiple lasing points
12 Areas of the Epitaxy Masked from Implant which will produce lasing
13 Etched isolation trench separating the Single Active Mesa Structure 11 and the Single Ground Structure 14
14 Single Ground Structure
15 Quantum wells between the top P mirror and the bottom N mirror—this is an active region where Photons are emitted
16 N mirror which has N contact layer or highly doped layers for N metal electrical contact location
17 Laser substrate FIG. 3 is a perspective view of the chip shown by FIGS. 1 and 2. The implanted region is invisible. The metal contacts are not shown. This illustration is to show the topology of the single mesa etch, which can be used for either top-emitting or bottom-emitting implanted devices. The process of implant can take place before or after top metal or etch.

Figure 4:
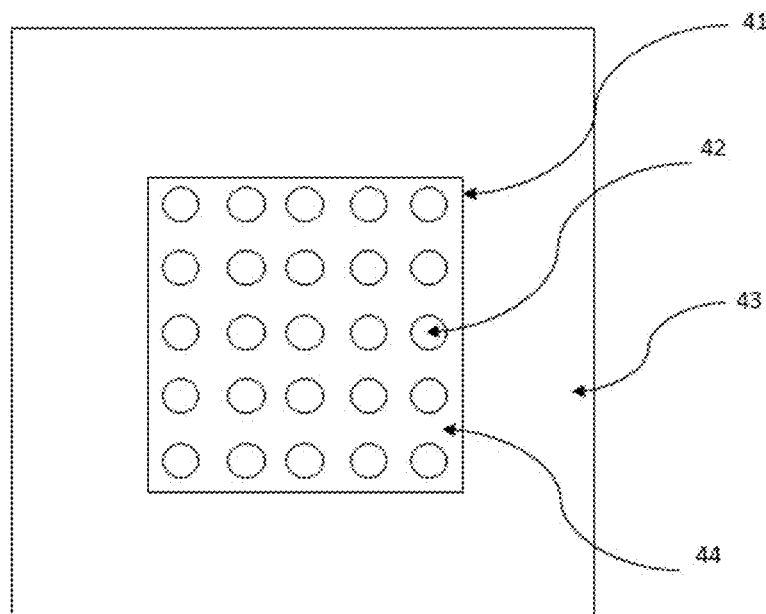
Figure 5:
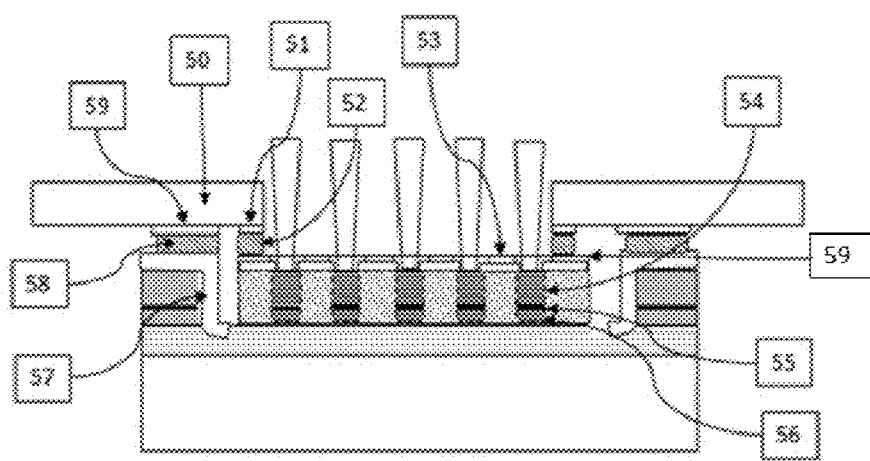

FIG. 4 shows a top view of the epitaxial side of an example top emitting VCSEL grid structure. The view is through a square hole in the top electrical waveguide which is bonded by a solder process to the laser chip. The isolation etched region is hidden in this view by the electrical waveguide. The round disks on this illustration are the holes in the top metal contact or plated metal contact region over the single solid mesa structure. FIG. 4 shows:
41 Hole in substrate with waveguide underneath
42 Holes in the top P metal so laser beams can emit through
43 Top of waveguide substrate
44 Top spreading metal on laser chip FIG. 5 illustrates a cutaway view of the bonded electrical waveguide and laser chip shown by FIG. 4. The signal contact for the electrical waveguide is opened to allow the beams to propagate through the opening. Another option of this embodiment would be to have a transparent or transmitting substrate material for the waveguide instead of a hole for the lasers to propagate through. A transparent material such as CVD (Chemical Vapor Deposited) diamond or sapphire or glass could be an example of that material. This figure shows the embodiment with a substrate such as AlNi which is opaque and thus needs a hole or opening. Notice the isolation region is separating the single mesa structure from the single mesa ground or structure or "frame" structure which is shorted to ground.

These P and N contacts are bonded to a high speed electrical contact (see also FIG. 7B, reference numbers 751 through 754). The ground-signal-ground (GSG) electrical waveguide substrate and laser chips are aligned (see FIG. 14B) so that the negative mesa is bonded to the negative part of the waveguide and the positive active areas which lase are aligned to the signal pad. This alignment is defined by a bonder, then heat and pressure are applied to bond the solder that has been deposited on one chip or the other (see FIG. 15) The high speed nature of this contact arises because the p pad is separated from the n wafer ground by plating and solder heights but mostly by removing it off the laser substrate and placing it on an electrical waveguide substrate. The physical separations dramatically reduce capacitance, thereby increasing the frequency response (where the frequency response is limited by the capacitance of the circuit) and yielding high frequency operation for the lasing grid.

In an example embodiment, for high speed operation, the surface connects to the electrical contact at the bottom of epi design, which is accomplished through the isolation trench (see, for example, FIG. 7A reference number 702) surrounding the single structure (see, for example, FIG. 7A (reference number 717)). This structure is not based on mesa topology but is simply shorted to the electrical region of the N contact metal (see FIG. 7A (reference number 703)) through the metal plating (such as in FIG. 7C reference number 782). This is not a built up structure or raised structure as described in US Pat App. Pub. 2011/0176567 but rather uses the chip surface and the epi material to be a surface for bonding, which also makes the device much more stable and robust at bonding.

Returning to FIG. 5, the GSG Signal Pad 51 has Solder 52 electrical connecting the P Contact Metal on the top of the Active Single Mesa Structure. This allows the signal or current to be injected into the metal contact structure with holes in it for laser propagation and then the current flows through the non-implanted regions of the epitaxial structures forcing current to be confined to just those defined regions. The top P mirror region has a slightly lower reflectance than the bottom N mirror allowing the light to emit from the top of the epitaxial structure. The current flows on through the quantum wells which produce the light and heat in there junction, and into the n mirror where it proceeds to the N contact region in or near the n mirror. The current would then proceed up the shorted frame structure which is bonded and in electrical contact to the ground portion of the GSG electrical waveguide. This structure which utilizes top emitting design can be used for lower wavelength output designs which are lower than the transmission cutoff of the GaAs or laser substrate material. Back emitting structures can typically only be designed for wavelengths above ~905 nm. This top emitting structure could be used with ~850 nm or lower to the limits of the epitaxial material set.

A single solid structure isolated from a surrounding ground with an etch where the single solid structure has within it ion implants; the implants are invisible but cause the semiconductor material to be nonconductive because of the crystal damage it causes. In order to make an implanted device you must mask the areas that are to be protected from the damage first.

Small mesas are formed with photoresist positioned by a photolithographic process which protects the epitaxial material from damage then is washed off after the implant takes place. The implant happens in an ion implant machine which accelerates ions down a tube and you put the wafer in front of the stream of ions.

Figure 24:
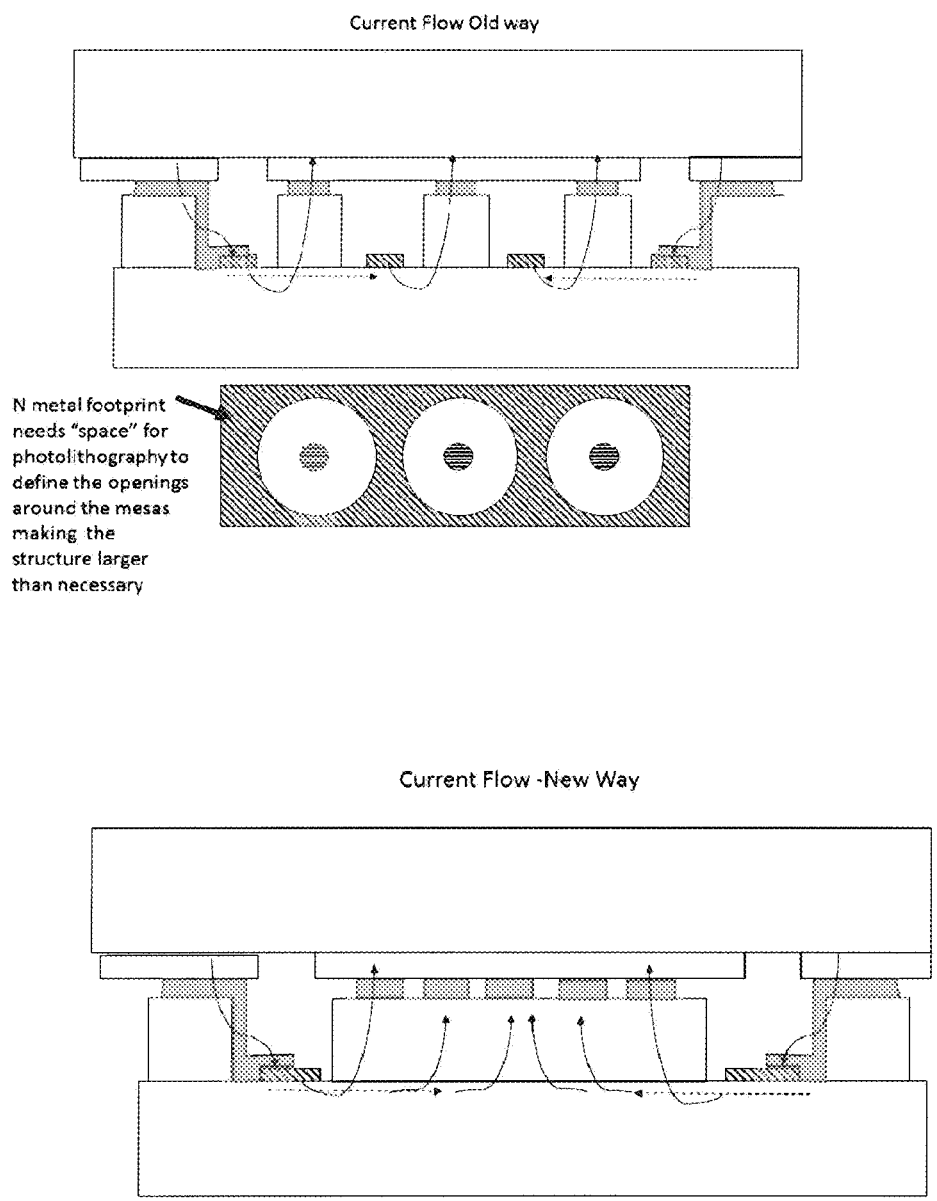
FIG. 24 comparatively shows current flow as between an example embodiment designed as described herein and that taught by US Pat App. Pub. 2011/0176567.

Implanted ions can create areas of the semiconductor material that are non-conductive. These areas of non-conductive material will force the current flow through the lase areas. These non-conductive areas can also be created by etching a pattern similar to FIG. 1 and oxidizing the single structure as described below in connection with Embodiment 2. FIG. 5 shows:
50 Non Conducting Electrical Waveguide Substrate
51 Signal metal of electrical waveguide
52 Solder metal for bonding electrical waveguide to laser chip
53 Plated Metal shorted to P Contact Layer and electrically connected to Signal pad of GSG electrical waveguide
54 P Output Mirror-Diffractive Bragg Reflector
55 Active Region-Quantum Wells
56 N Mirror where low resistance contact Layer is located
57 Plated Metal shorting or in electrical contact with N Contact layer and to Ground Mesas 58 Solder in Electrical contact with Ground pad of electrical high speed waveguide and in electrical contact with Grounded Mesa structure 59 Area on Plated metal connected to P Metal on single mesa structure for contacting signal pad on high speed electrical waveguide FIG. 24 shows a comparative view of different current flows as between an embodiment such as Embodiment 1 and the design taught by US Pat App. Pub. 2011/0176567. With US Pat App. Pub. 2011/0176567, each mesa is surrounded by an N metal contact area. This takes precious space or real estate on the chip as the processing to define those footstep metal n contacts around each mesa require photolithography which limits how closely you can space the mesas together. These limits lead to a lower power output per unit area than the new method. Therefore the goal of this old apparatus was an array for highest power and speed yet did not take into account the vast improvement in power/area which would also be an improvement in the ultimate goal of highest Power with the highest Speed. Also, this old method's N contact had to be large because of the structural limitations from the old method has been removed with the new single structure.

With the new design described herein, a single structure has several lasers on it and only one contact around that single structure. The new structure reduces that N metal area to the outside of the structure making the area per light element much smaller. This involves a large N contact layer calculated to carry the current load of the single structure. The higher current flow from the single contact can be realized through thicker metal and or thicker N contact region.

Embodiment 2 for US Pat App Pub 2017/0033535—Bottom-Emitting Implant

FIG. 6 illustrates a cutaway view of an example of a second embodiment, where the second embodiment is a bottom-emitting device with implanted regions for current confinement. The GSG electrical waveguide can be seen solder bonded to the frame -ground structure and the active single laser mesa structure. FIG. 6 shows:

601 Electrical Waveguide Substrate
602 Ground Contact and Signal Contact in that order of GSG Electrical Waveguide
603 Solder -Bonding GSG Waveguide to Laser Chip
604 Plating Metal electrically connecting Signal pad of Electrical Waveguide to Lasers P contact
605 P contact Metal
606 Implanted Region that has been rendered non conductive
607 P mirror
608 Active region (quantum wells)
609 N Mirror
610 Conducting Layers in N Mirror where Implant has not reached
611 Laser Beams Propagating through Laser Substrate
612 Plating Metal shorted to N contact region
613 Frame Area Shorted to N Contact region
614 Solder electrically contacting N contact on Laser to Ground on Electrical Waveguide
615 Etched region isolating large single mesa from Ground Frame Process for Embodiments 1 and 2 of US Pat App Pub 2017/0033535

An example embodiment of the process steps to create the single structure for embodiments 1 and 2 with implant current confinement can be as follows.

Step 1. Use photolithography to mask areas which will not have P Metal deposited.

Step 2. Deposit P Metal (typically TiPtAu ~2000 A)

Step 3. Photolithography lift off and wafer cleaning. O2 descum or ash all organics off wafer.

Step 4. Dielectric deposit (typically SiNx~<1000 A) used as an etch mask

Step 5. Photolithographic masking using either photoresist or metal deposited in areas to protect the epi material from being damaged from the implant which makes the unprotected regions non-conductive through ion bombardment. This step can be performed later in the process but may be more difficult due to more varied topology.

Step 6. Implant—Those skilled in the art of calculating the implant doses will determine the dose and species of implant needed to disrupt the materials structures to the depth which will isolate the p regions and the quantum wells from each other—

Step 7 Cleaning this photolithography is difficult due to the implant and a deposition of metal over the photolithography such as plating could help to make it easier to clean off the resist.

Step 8. Use photolithography to mask areas of dielectric which will not be etched. This is the unique part which is the design of the mask which creates a large isolated structure down implants within that structure define where current cannot flow.

Step 9. Use plasma etch to etch through dielectric (typically Fl based etchant) can use wet etch such as BOE (buffered oxide etch).

Step 10. Etch pattern into Laser or Light Emitting Diode Epitaxial material. Stop on Substrate or doped electrical contact layer. This isolates a single large structure from the N shorted regions around the chip Step 11. Clean off mask. O2 descum or ash all organics off wafer.

Step 12. Use photolithography to mask areas which will not have N Metal deposited.

Step 13. Deposit N Metal (Typically GeAu/Ni/Au eutectic composition of 80% Au/20% Ge by atomic weight. Total thickness of AuGe layer ~3000 A or more with ~200 A Ni or more of other diffusion barrier metal and ~5000 A of Au or more This is also unique hear where the n metal is deposited in the n contact etched region and also up and over the N contact structure shorting the structure to the n-contact.

Step 14. Clean off mask (typically called lift off). O2 descum or ash all organics off wafer.

Step 15. Dielectric deposit (typically SiNx ~2000 A) used as a non-conductive isolation barrier Step 16. Use photolithography to mask areas of dielectric which will not be etched.

Step 17. Use plasma etch to etch through dielectric (typically Fl based etchant) can use wet etch such as BOE (buffered oxide etch).

Step 18. Clean off mask. O2 descum or ash all organics off wafer.

Step 19. Use photolithography to mask areas which will not have Plated Metal deposited.

Step 20. Plate areas with ~4-5 um of Metal (typically Au) or Cu if diffusion barrier can be deposited first.

Step 21. Use photolithography to mask areas which will not have Solder deposited.

Step 22. Deposit Solder Metal (Typically AuSn/Au eutectic composition of 80% Au/20% Sn by atomic weight. Total thickness of AuSn layer ~40000 A (4 microns)or more with ~500 A Au on top to stop any oxidation of Sn. This layer can be patterned and deposited on the submount with electrical waveguide which is bonded to the laser grid.

Embodiment 3 for US Pat App Pub 2017/0033535—Top-Emitting Oxidation

In a third embodiment, oxidation rather than ion implantation is used to create the grid of top-emitting lasing regions within the single structure. For example, a patterned etch can isolate conductive paths in a single structure, creating a grid of light sources. This structure exhibits multiple laser emission points from the single structure. The lasing structure is isolated with an etched region from the ground contact that forms the outside perimeter of the chip. This structure for Embodiment 3 is top emitting. The conductive areas of the grid are where light will be emitted. The positive electrical contact can be a grid with openings where the light is emitted.

The epitaxial material of the laser wafer can be a VCSEL design, and most VCSELs are top emitting. The distribution of the signal using a p type waveguide pad is typically on the laser wafer, but it should be understood that in an oxidated single structure embodiment that has a back emitting design, the waveguide can be on a separate substrate that is separated from the laser n material or layer.

FIG. 7, which shows an example of Embodiment 3, illustrates an example pattern etched into a wafer to create a single structure which allows multiple point lasing. The single structure of an embodiment such as that shown by FIG. 7 is much more rigid than the thin columns made of fragile crystal material as taught by US Pat App. Pub. 2011/0176567. Also, as explained with respect to an embodiment discussed above, it should be understood that pattern of lasing areas other than that shown by FIG. 7 may be employed if desired by a practitioner.

In FIG. 7, the diagonally striped areas are preferably etched down to create the patterned single mesa structure in the middle of the isolation trench. All diagonally striped areas are preferably etched down to the bottom N electrically conductive layer 705 in FIG. 7A or typically the larger isolation trench will be etched to the electrical contact buried in the epitaxial design, while the smaller patterned etch areas must go deeper than the active region which isolates the lasing points. The patterned structure in the middle of the isolation trench is a single structure with "shaped" holes etched into it.

The holes in the large single mesa are large in this case. These holes allow the oxidation process environment to oxidize the layers in the epitaxial region. The oxide layer or layers has high aluminum content and forms $AlO_2$ that grows laterally through the layer until taken out of the oxidation process. White areas are the surface of the chip, dotted lines are where oxidation limits current flow to unoxidized areas only. The holes in the large single mesa are large in this case. These holes allow the oxidation process environment to oxidize the layers in the epitaxial region. The oxidation layer can be formed by using a high Al content layer in the epi design structure which is buried below the surface. The etched areas expose that layer which is then placed in an oxidation chamber allowing the exposed layer to oxidize inward, where $AlO_2$ grows laterally through the layer until taken out of the oxidation process. As the length of the oxidation grows in that thin layer, it isolates or closes off the current paths with a dielectric material of $AlO_2$ that is formed during the oxidation process. If the areas 7005 are etched, then the oxidation will continue to grow until only areas 7008 are conductive and the area or part of the epitaxial layers which conduct the current through that section. Electrically conductive areas allow current flow through the quantum wells (see FIG. 7A reference number 707) and produce lasing as the light is trapped in the cavity between the p mirror 709 and N mirror 706.

The oxidation length can be seen in FIG. 7 as dotted lines, all about the same distance from any one exposed edge or holes in the large single structure that has holes formed in it. FIG. 7 also shows the large single mesa ground structure. Three views of cross sections are illustrated to identify where FIGS. 7A, 7B, and 7C are located. Note 7B which clearly shows through this cross section that the mesa in the center is a single structure.

FIG. 7 shows:
7001 Frame (Single Shorted Mesa) for Electrical Contact to Ground of Electrical Waveguide
7002 Etched region isolating large single mesa from Ground Frame
7003 Single Mesa Structure with Etched Holes
7004 Indents in Edges to keep edges of Single Mesa Structure Oxidized and Non Conductive
7005 Etched Hole in Single Mesa Structure
7006 Oxidation Pattern around any Etched Edges
7007 Overlapped Oxidized Areas not allowing Current Flow
7008 Laser Aperture where Current Flows freely (same as 761 in FIG. 7B)
7009 Gap in Shorted Mesa Structure to Reduce Capacitance from Ground to Signal Pad on Electrical Waveguide FIGS. 7A, 7A2 and 7B are side views of the example FIG. 7 embodiment.

FIG. 7A2 shows the etched holes 727 that allow the oxidation 731 to form, which confines the current into region 761 of FIG. 7B, for formation of laser beams 763.

Reference number 706 in FIG. 7A is a p mirror diffractive Bragg reflector (DBR) which has one or more layers in it with very high aluminum content 708 which when exposed to hot damp conditions oxidizes 708 confining the current to the areas 761 shown by FIG. 7B, which are where the laser beams come out. The N mirror DBR 709 has a conductive layer 705 to take the current flow out through the N metal ohmic contact 703 to the plating 782 (see FIG. 7C) which goes up and over the single ground mesa structure 718 (see FIG. 7A) to the solder 717 and electrically connecting to the N plating on the GSG waveguide 716 and into the N contact 715 of the waveguide.

Current confinement is a major part of a semiconductor laser. The concept is to force the current flow away from the edges of the structure so there is not an issue with current flowing near rough surface states that may exist from the etch. The current flow is also ideally concentrated to create lasing by increasing the current density in the material The current confinement occurs either by oxidation through allowing the high concentrate layers of Al to get exposed by hot damp conditions in the oxidation process enabled by the drilled holes (e.g., this Embodiment 3), or by the implant to render all other areas nonconductive (e.g., see Embodiments 1 and 2).

FIG. 7A shows:
701 Electrical Waveguide Substrate
702 Etched region isolating large single mesa from Ground Frame
703 N Metal contact electrically contacting N contact layer 704 N Mirror
705 N Contact layer in N mirror (low resistance for ohmic contact)
706 N Mirror above N contact region
707 Active region (quantum wells)
708 Oxidized Layer Closing off Current in these Regions
709 P mirror
710 Dielectric Layer
711 Plating on top of P contact Metal
712 Aperture in P Contact Metal and Plating Metal for laser beam exit
713 Electrical Waveguide Substrate
714 Ground Contact of GSG Electrical Waveguide
715 Signal Contact of GSG Electrical Waveguide
716 Solder-Bonding GSG Waveguide to Laser Chip
717 Solder-Bonding GSG Waveguide to Laser Chip
718 Frame structure electrically connected to N contact region of laser chip FIG. 7A2 is a continuation of FIG. 7A above, and it further shows:

721 Ground Contact of GSG Electrical Waveguide
722 Plating on Ground Contact of GSG Electrical Waveguide
723 Solder-Bonding GSG Waveguide to Laser Chip
724 Signal Contact of GSG Electrical Waveguide
725 Solder-Bonding GSG Waveguide to Laser Chip
726 Plating on Signal Contact of GSG Electrical Waveguide
727 Etched Hole Regions in Single Mesa Substrate permits oxidation to form Current Confinement Apertures
728 Plating on top of P contact Metal
729 Opening in Dielectric layer for electrical contact from Plating to P Contact Layer on Laser Single Mesa Structure
730 Dielectric Layer
731 Oxidation Layer closing off current near Etched Hole Regions FIG. 7B is a FIG. 7 cutaway view that also shows the electrical connections and electrical waveguide that are not shown in FIG. 7. FIG. 7B illustrates the cross section through the apertures created by the oxidized layer. The oxidized layer is exposed to the oxidation process through the holes in the single structure illustrated in FIG. 7A. This view also shows that the Active Mesa Structure is truly a Single Mesa Structure. FIG. 7B depicts:

751 Ground Contact of GSG Electrical Waveguide
752 Plating on Ground Contact of GSG Electrical Waveguide
753 Solder-Bonding Ground of GSG Waveguide to Laser Chip
754 Signal Contact of GSG Electrical Waveguide
755 Plating on Signal Contact of GSG Electrical Waveguide
756 P contact Metal on Laser Chip
757 Opening in plating and P Contact Metal over Laser Aperture
758 Plating on P Contact Metal
759 Solder-Bonding Signal of GSG Waveguide to Laser Chip
760 Dielectric Layer Protecting Active Mesa Structure from N Contact
761 Current Confinement Aperture formed by opening in Oxidation Layer
762 Oxidation Layer Dielectric
763 Laser Beam Propagating through Metal Opening FIG. 7C is a cross sectional view of the area where the P Contact or Signal of the GSG waveguide is positioned below the Laser Chip where the N Contact Frame or single structure mesa grounded to the N contact of the laser is above the GSG Electrical Waveguide. The large gap between the Laser Ground and the P Signal Pad reduces the capacitance of the circuit enabling higher frequency operation. FIG. 7C depicts:

780 Dielectric Layer
781 N Type Ohmic Contact Metal
782 Plating Shorting N Metal Contact to Single Ground Mesa Structure
784 N Contact Layer in Epitaxial Growth
785 Plating Electrically Contacted to Signal Pad on Electrical Waveguide
786 Metal Signal Pad Lead on GSG Electrical Waveguide
787 Plating on Ground Pad of GSG Electrical Waveguide
788 Electrical Waveguide Substrate
789 Gap between Conductive Signal Pad Structure and N Contact Layer Reduces Capacitance Process for Embodiment 3 of US Pat App Pub 2017/0033535

An example embodiment of the process steps to create the single structure for embodiment 3 with oxidation current confinement can be as follows.

Step 1. Use photolithography to mask areas which will not have P Metal deposited.
Step 2. Deposit P Metal (typically TiPtAu~2000 A)
Step 3. Photolithography lifts off and wafer cleaning. O2 descum or ash all organics off wafer.
Step 4. Dielectric deposit (typically SiNx~<1000 A) used as an etch mask
Step 5. Use photolithography to mask areas of dielectric which will not be etched.
Step 6. Use plasma etch to etch through dielectric (typically Fl based etchant) can use wet etch such as BOE (buffered oxide etch).
Step 7. Etch pattern into Laser or Light Emitting Diode Epitaxial material. Stop on Substrate or doped electrical contact layer. Typically the etch is Cl based with some (high percentage) amount of BCl3.
Step 8. Clean off mask. O2 descum or ash all organics off wafer.
Step 9. Use photolithography to mask areas which will not have N Metal deposited.
Step 10. Deposit N Metal (Typically GeAu/Ni/Au eutectic composition of 80% Au/20% Ge by atomic weight. Total thickness of AuGe layer ~3000 A or more with ~200 A Ni or more of other diffusion barrier metal and ~5000 A of Au or more
Step 11. Clean off mask (typically called lift off). O2 descum or ash all organics off wafer.
Step 12. Dielectric deposit (typically SiNx ~2000 A) used as a non-conductive isolation barrier
Step 13. Use photolithography to mask areas of dielectric which will not be etched.
Step 14. Use plasma etch to etch through dielectric (typically Fl based etchant) can use wet etch such as BOE (buffered oxide etch).
Step 15. Clean off mask. O2 descum or ash all organics off wafer.
Step 16. Use photolithography to mask areas which will not have Plated Metal deposited.
Step 17. Plate areas with ~4-5 um of Metal (typically Au) or Cu if diffusion barrier can be deposited first.
Step 18. Use photolithography to mask areas which will not have Solder deposited.

Step 19. Deposit Solder Metal (Typically AuSn/Au eutectic composition of 80% Au/20% Sn by atomic weight. Total thickness of AuSn layer ~40,000 A (4 microns) or more with ~500 A Au on top to stop any oxidation of Sn. This layer can be patterned and deposited on the submount with electrical waveguide which is bonded to the laser grid.

Step 20. Separate laser chips from wafer with cleaving or dicing.

Step 21. Design and Fabricate electrical waveguide to align to laser chip with the design to allow high frequency operation.

Step 22. Align and Flip Chip Bond the laser chip to the Submount electrical waveguide Embodiment 4 for US Pat App Pub 2017/0033535—Bottom-Emitting Oxidation In a fourth embodiment, an oxidated single structure with multiple lasing regions is designed as a bottom-emitter rather than a top emitter. FIGS. 8 through FIG. 14C provide details about Embodiment 4 and illustrate the process which can be used to make this embodiment. The lasing grid's light is emitted through the substrate forming a back emitter.

Light is transmissive in GaAs from wavelengths around 900 nm and greater. If the wavelength of the light engineered in the epitaxial design is in the range ~900 nm and above, the GaAs substrate transmits the light or is transparent to the light. If the epitaxial design includes an N mirror that is less reflective than the P mirror, a laser such as a VCSEL can emit the light from the N mirror through the substrate. The laser beams will propagate through the material, and the substrate can be a platform for optical components to collimate, spread, diverge, converge or direct the light. This enables integrated optical circuits with extremely high bright power to be formed. The single structure and the ground contact can then be integrated to a high speed electrical waveguide substrate enabling high frequency responses from the entire grid. A ground signal ground electrical waveguide is ideal for this high speed electrical waveguide. Another type of electrical waveguide that may be used is a microstrip waveguide (see FIG. 15), where the signal pad is separated from the ground pad by a thin dielectric layer on a substrate.

Figure 8:
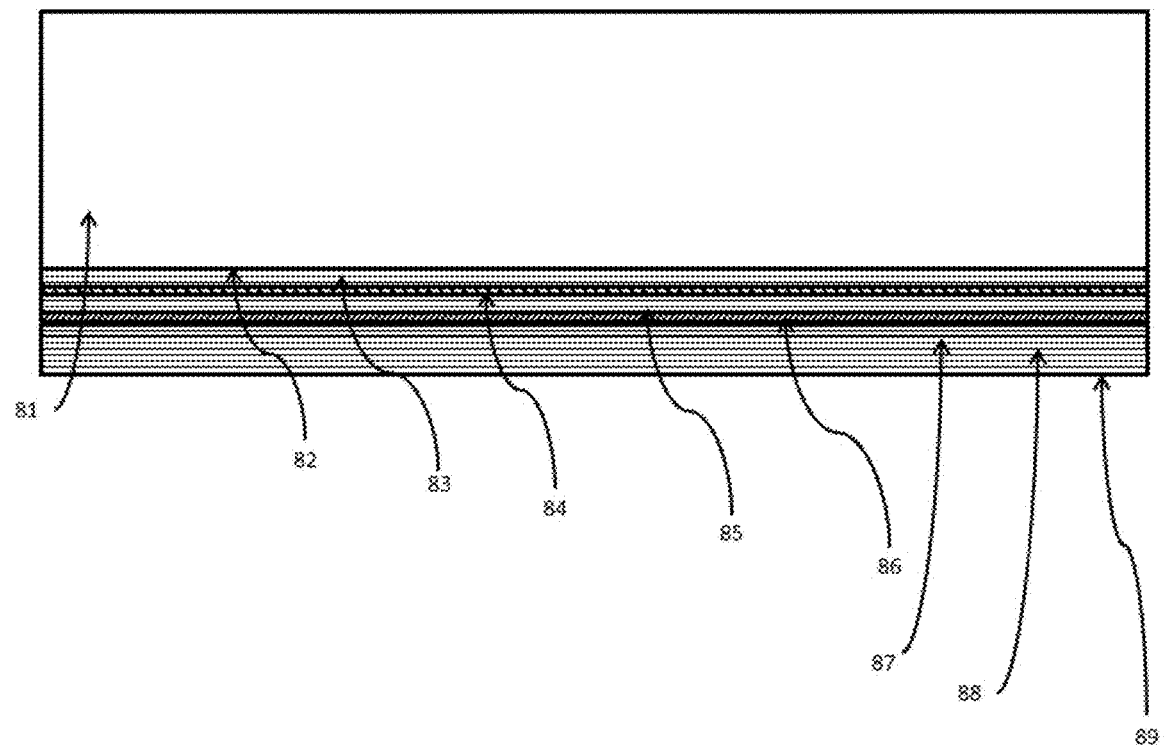
Figure 9:
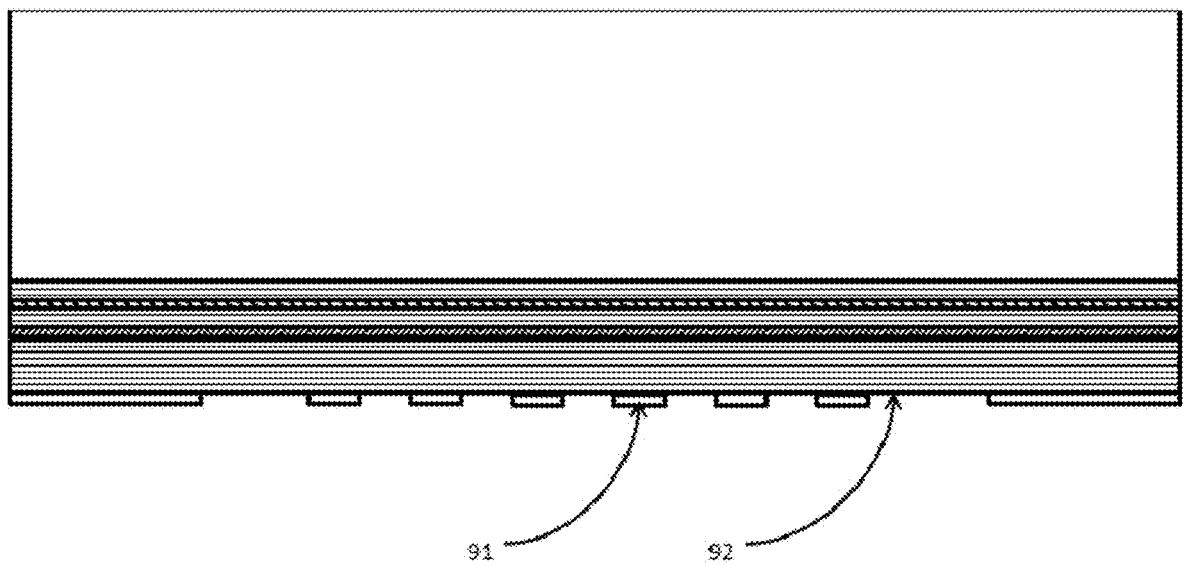

FIG. 8 is an illustration of a typical epitaxial design. Any high speed design can be used for VCSEL devices. FIG. 8 shows:
- 81 GaAs substrate
- 82 Possible position for low resistance contact layer
- 83 N Mirror layer after contact region
- 84 Low resistance N contact region
- 85 N Mirror layer after quantum wells
- 86 Quantum Well Region
- 87 Oxidation layers
- 88 P Mirror
- 89 Low resistance P Contact layer FIG. 9 is an illustration of the first process performed, which is P metal deposit. This is typically a Ti/Pt/Au Layer on top of the highly P doped Contact Layer forming an ohmic contact.

Figure 10:
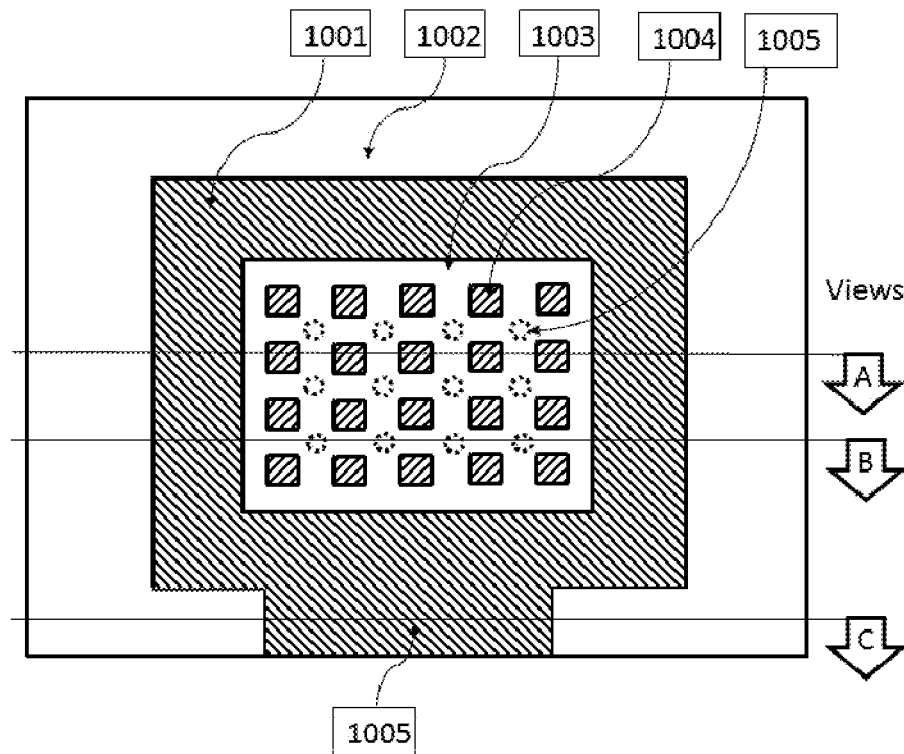
Figure 10A:
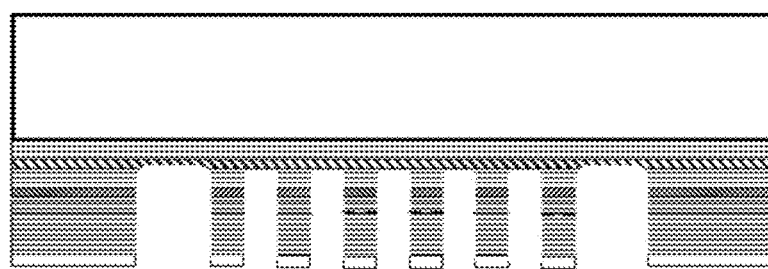

FIG. 9 shows:
- 91 P Metal forming Ohmic Contact after annealing process
- 92 Low Resistance P Contact Layer FIG. 10 is a top view of the etch of the epitaxial layer down to the N contact layer. FIG. 10 shows:
- 1001 Etched Area to N Contact Layer
- 1002 Single Mesa Ground Structure
- 1003 Single Mesa Active Structure
- 1004 Etch Hole to Allow Oxidation Process to form Apertures
- 1005 Area in between all holes where there will be no oxidation which forms conductive current confinement FIG. 10A is a cross section view A of FIG. 10 formed before oxidation process, and FIG. 10A2 is a cross section view A of FIG. 10 formed after oxidation process. FIG. 10A2 shows:
- 120 Oxidation completely closes off conductive path near any etched regions that were exposed during the oxidation process.

Figure 12:
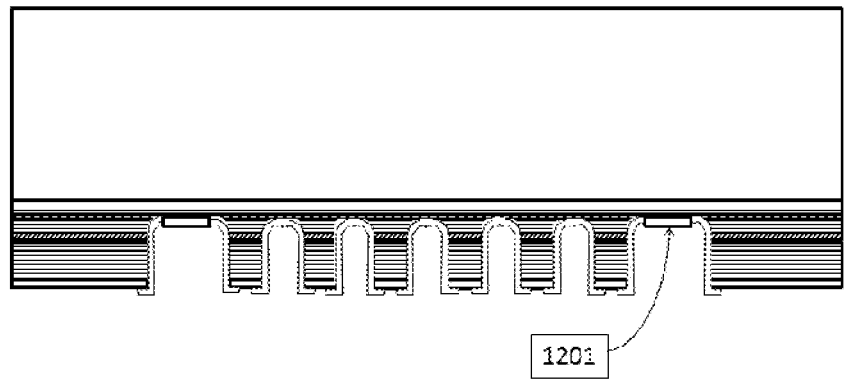

FIG. 10B is a cross sectional view B of FIG. 10 illustrating where the current confinement apertures were formed in the areas shown. This view represents a section of the single mesa where no holes are penetrating the cross section, and clearly shows that the mesa structure is a Single Mesa Structure enabling a more robust structure preferred at the bonding process. FIG. 10B shows:
- 125 Current Confinement Aperture is conductive region of Single Mesa Structure
- 126 Oxidized Layer forming as dielectric layer near where holes where etched
- 127 P Metal Contact Layer FIG. 11 illustrates the dielectric layer deposited and patterned with opened via "holes" for electrical contact to the epitaxial contact layers and sealing the semiconductor for reliability purposes. FIG. 11 shows:
- 1101 Dielectric Layer patterned with openings or "vias"
- 1102 Opening in Dielectric Layer to P Contact Metal
- 1103 Contact Layer on Single Mesa Ground Structure FIG. 12 shows the N metal contact after it has been deposited. FIG. 12 depicts:
- 1201 N Contact Metal is deposited over the N Contact via hole to make an electrical connection to the N Contact Layer.

Figure 13:
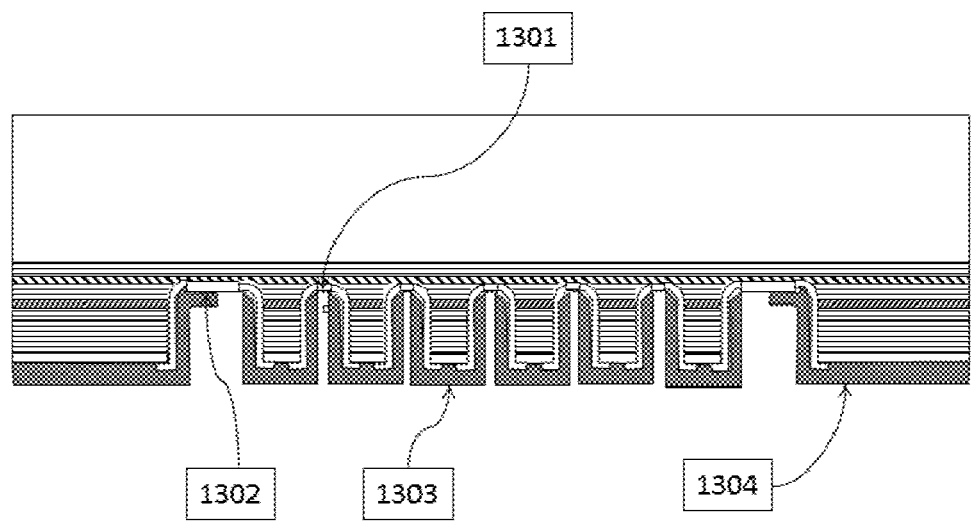

FIG. 13 illustrates the next step of plating metal which shorts the N contact region to the top of the single grounded frame region, which will be bonded and electrically conductive to the ground pad of the GSG waveguide. The plating also adds height to the active region reducing capacitance and it removes heat from the active region of the devices to give the devices better performance. The plating over the active single structure is isolated from the N mirror and N contact region by the dielectric layer. FIG. 13 shows:
- 1301 Dielectric Layer preventing the Plating covering the Active Region and extending into the holes of the single mesa structure
- 1302 Plating Covering Single Grounded Mesa Structure Shorted to N Contact Region through N Contact Metal
- 1303 Plating Covering Active Structure and extending into the holes of the active region where cooling can occur through a higher thermal conductance of the plating metal
- 1304 Plated Metal extending over single frame structure for bonding and electrically connecting to ground of GSG electrical waveguide.

Figure 14A:
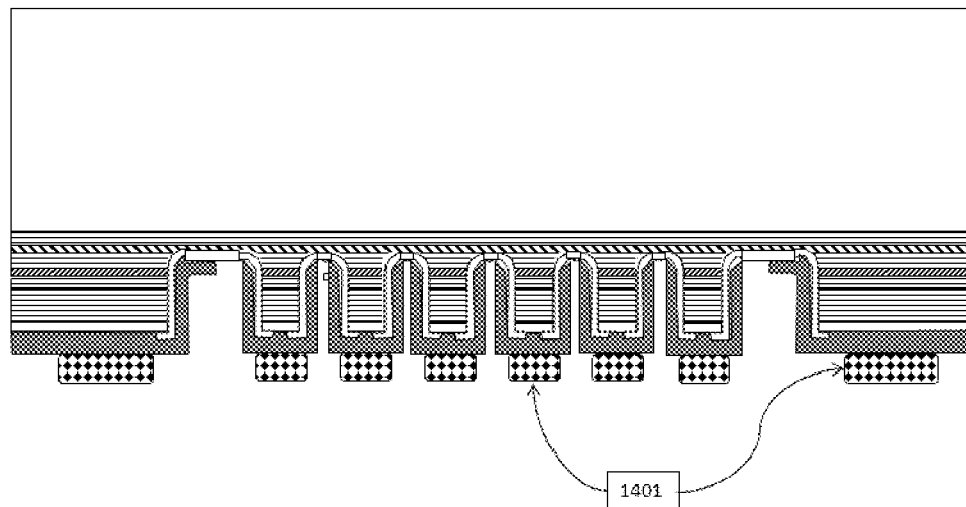
Figure 14B:
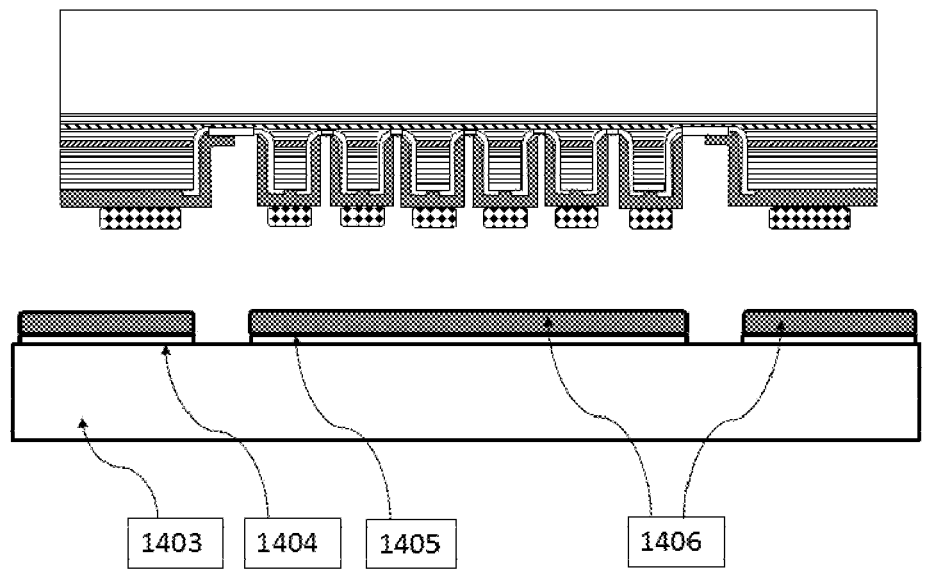

FIG. 14a illustrates solder deposited on the laser chip. This serves as the electrical conductive bonding adhesion layer between the laser chip and the high speed electrical waveguide. FIG. 14a shows:
- 1401 Solder deposit FIG. 14b illustrates the alignment of the GSG electrical waveguide before bonding. FIG. 14b shows:
- 1403 Submount for GSG Electrical High Speed Waveguide

1404 Ground Pad for GSG Electrical High Speed Waveguide

1405 Signal Pad for GSG Electrical High Speed Waveguide

Figure 14C:
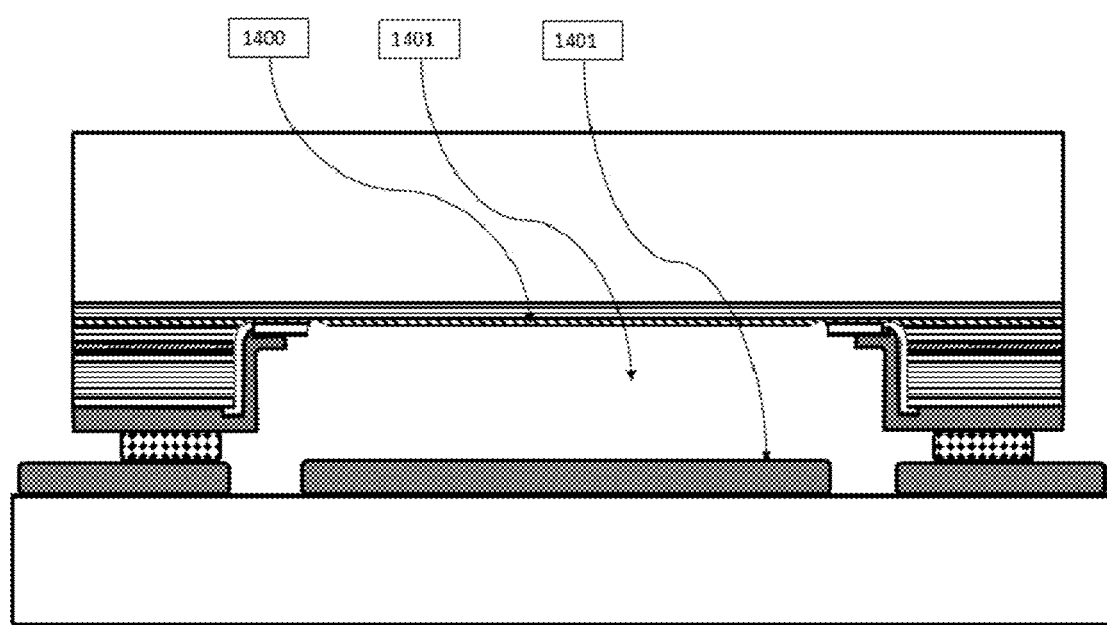

1406 Plating Metal Deposited on Conductive areas of GSG Electrical High Speed Waveguide FIG. 14C illustrates the bonded laser chip to the GSG electrical waveguide. The gap in the single grounded mesa enables high speed operation by reducing capacitance.

Embodiment 5 for US Pat App Pub 2017/0033535

Figure 15:
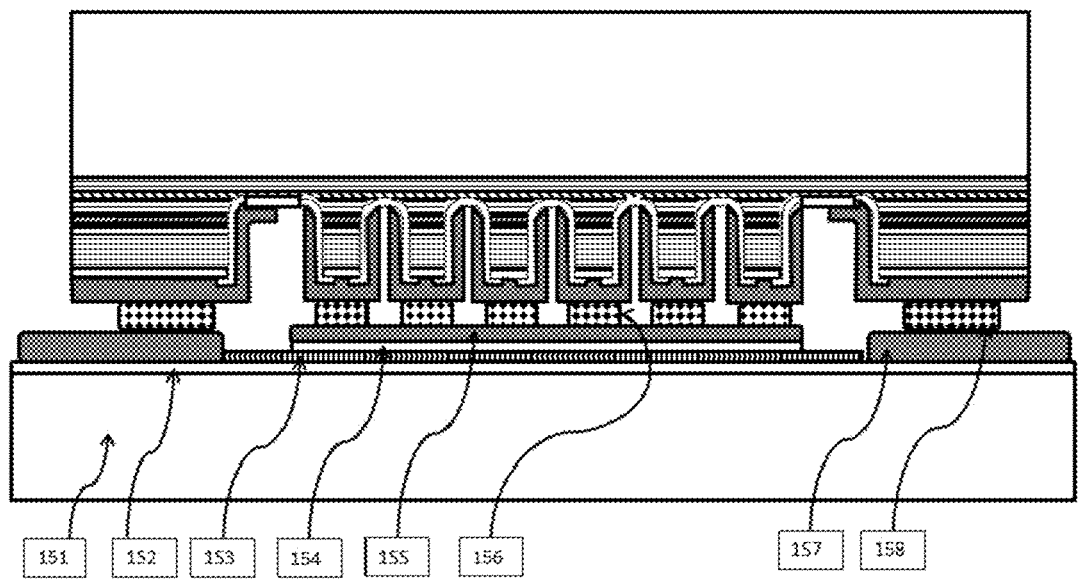
FIG. 15 shows a view of an example microstrip embodiment.

In a fifth embodiment, a microstrip or strip line electrical waveguide is used rather than the GSG waveguide, as shown by FIG. 15. This embodiment can also have the gap mentioned in FIG. 14c above. This electrical waveguide can also be formed by a ground layer below a thin dielectric with a signal lead on the top of the dielectric forming a strip line or microstrip waveguide. Openings in the dielectric can be used to contact the ground portion of the lasing grid. The width of the lines and thickness of the dielectric can be controlled to produce a specific impedance value for circuit matching characteristics. It should be understood that this technique can also be used for other embodiments, such as Embodiment 2 or any of the embodiments discussed below. The view in FIG. 15 shows a cross section across the active single mesa structure:

151 Waveguide substrate
152 Metal Ground Pad across the entire waveguide
153 Dielectric layer separating the Ground from the signal pads
154 Metal Signal Pad
155 Metal Plating on Signal pad
156 Solder electrically connecting the signal pad to the single active mesa shown here with gaps or holes etched into it.
157 Metal Plating on the Ground Pad
158 Solder electrically connecting the ground pad to the single grounded mesa Embodiment 6 for US Pat App Pub 2017/0033535

Figure 16:
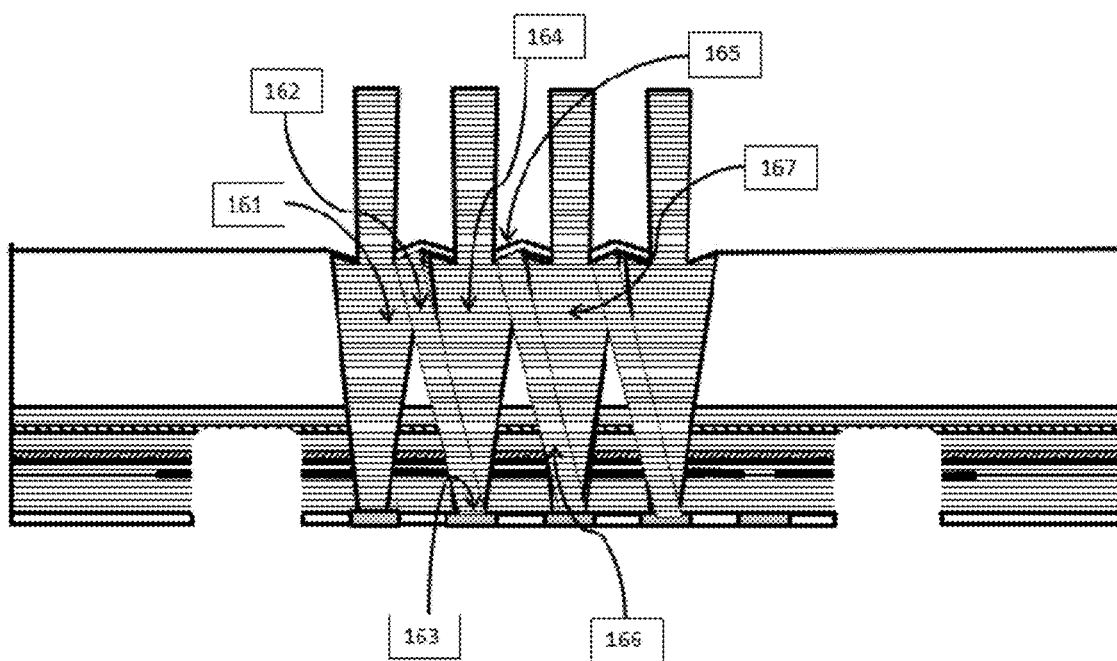
FIG. 16 shows a view of an example phase coherent embodiment.

FIG. 16 shows a sixth embodiment. In FIG. 16 the structure is unique in that it leaves paths for a portion of the light of each lase point to be directed to another laser next to it in order to keep the lasing in phase. In this example the laser 161 has some of its outer mode structure reflected 162 down to the laser aperture next to it 163 which produces light in phase with 162. The laser which is in phase is 164 and in turn reflects from an angled reflective surface 165 back to the aperture of the laser next to it 167 which is also in phase with 164 and 161 and so on. An angular and or reflective area 164 just outside of the lens or output area can divert a small portion of the light which is overflowing from the lens or output diameter to the lasing grid adjacent to it, enabling a coherent lasing grid. Some of the light from the neighboring lasing points is injected into the lasing point which sets up the lasing points in a phase relation with each other. This allows a coherent operation of all lasing points when the structure directs some of the light from each laser to its neighbor. The reflectance, distance and angles are very precisely calculated by one skilled in the art of optical modeling. Coherent operation is a benefit which has eluded laser array operation for many years. FIG. 16 shows:

161 Large aperture laser with wide divergence only emitting a portion of the light
162 A portion of the light from laser 161 is reflected to aperture 163
163 Aperture of laser where reflectance conforms to the phase of the light from 162
164 Large aperture laser with wide divergence only emitting a portion of the light
165 Angled reflective surface on the back of the laser chip just outside the output aperture
166 the reflected beam in phase with laser grid 164
167 Large aperture laser with wide divergence only emitting a portion of the light Embodiment 7 for US Pat App Pub 2017/0033535

Figure 17:
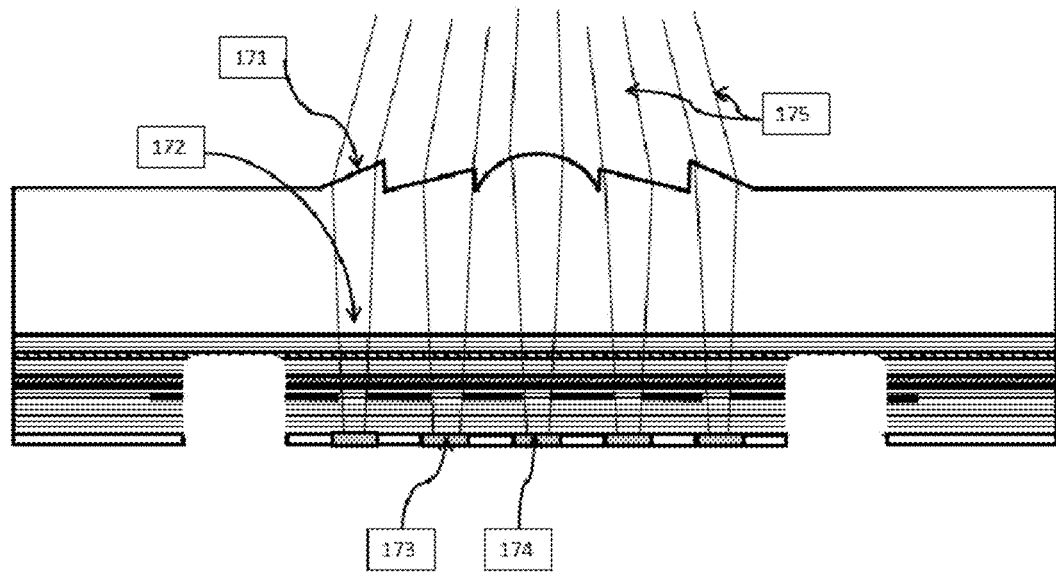
FIG. 17 shows a view of an example embodiment that employs diffractive optical elements.

FIG. 17 shows a seventh embodiment. In FIG. 17, the back side of the lasing grid chip has etched patterns to redirect the laser light 172 to particularly beneficial areas. This is accomplished by diffractive optical elements (DOE) 171, which have the surface etched in a way that when light travels through that portion, the angle of the surface and redirects 175 beams or light depending on the angle of the surface of the DOE. This can be used to collimate or diverge, direct or homogenize the light. FIG. 17 does not illustrate the electrical waveguide. The mode can be controlled by the aperture sizes and characteristics of the reflective surface 173 and 174.

FIG. 17 shows:
171 Redirected Laser Grid Beam from beam 172
172 Laser Grid Beam emitted from apertures
173 Contact and back of mirror for back emitting laser grid
174 Contact and back of mirror for back emitting laser grid
175 Redirected beams from laser grid Embodiment 8 for US Pat App Pub 2017/0033535

Figure 18:
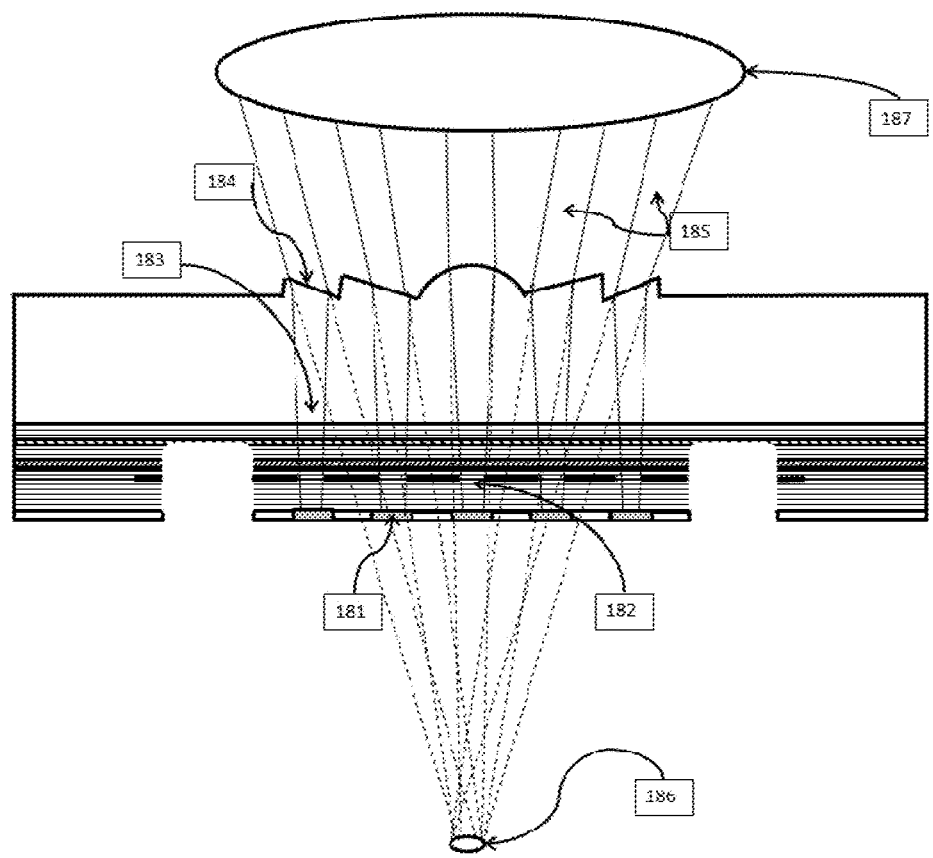
FIG. 18 shows a view of an example embodiment that employs pattern diffractive grating.

FIG. 18 shows an eighth embodiment. In FIG. 18, a patterned diffractive grating 184 (this is the opposite angular pattern than FIG. 17's DOE) is placed or etched over the emission points 181 on the backside of the laser wafer in a back emitting VCSEL design which directs the lasing points outward 185 from the grid. From the lens it looks like all the lasers are coming from a single point 186 behind the chip to form a virtual point source where a macro lens 187 can be used to collimate the beam from the virtual converged source behind the chip. FIG. 18 shows:

181 Contact and back of mirror for back emitting laser grid
182 Aperture creating laser characteristics
183 Laser Beam from laser grid
184 Surface of Diffractive Optical Element (DOE) angled for specific total beam grid characteristics
185 Redirected beams from laser grid
186 Converged virtual light source from all beams as seen from lens 187
187 macro lens with focal point on virtual convergence point 186

Embodiment 9 for US Pat App Pub 2017/0033535

Figure 19:
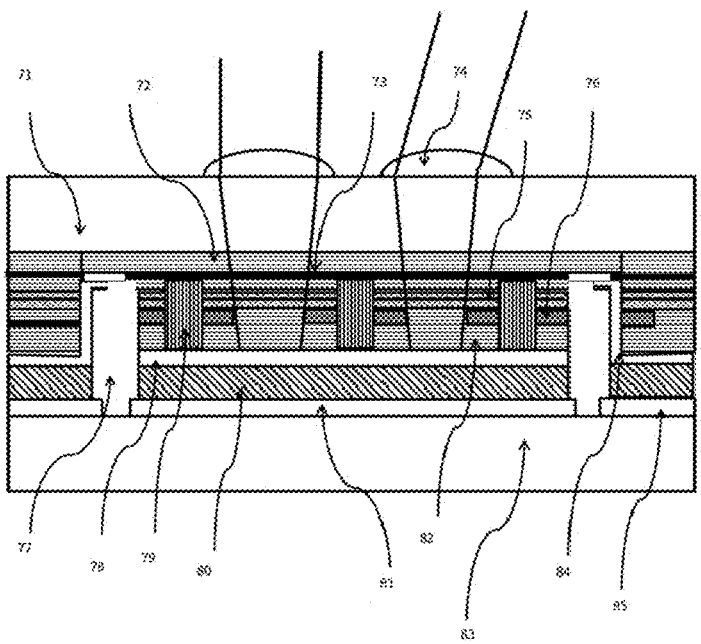
FIG. 19 shows a view of an example microlens embodiment.

FIG. 19 shows a ninth embodiment. FIG. 19 illustrates a cross section of the bonded etched and oxidized Embodiment 3, except it has microlens which have been processed on the back of the laser chip and positioned so that one is aligned to the other and one is slightly misaligned on purpose in order to redirect the laser beam emitted from the single mesa structure. While embodiment 3 is referenced for this arrangement, it should be understood that any of the above back emitting embodiments and a microlens array attached to the chip or positioned above the output grid can be used. The microlens array can have values related to the pitch of the light conducting grid points but with a slightly different pitch lens 74 forcing the light emitted by the lasing points to be directed to a single area where the beams come together or seem like they come together in front of the chip or behind the chip as in a virtual point source. If the microlens pitch is smaller than the laser pitch, it will guide the outlying lasers to a point in front of the chip or directed inward. If the microlens arrays pitch is larger than the lasers' grids' pitch, the light will be directed outward as in FIG. 19. FIG. 19 shows:
- 71 Laser Substrate
- 72 N Mirror
- 73 N Contact Region
- 74 MicroLens slightly offset from laser directing laser light outward
- 75 Active region or quantum wells
- 76 Oxidized layers creating current confinement into the active area
- 77 Etched trench creating isolation from the single ground structure and the active single mesa structure
- 78 P Metal Contact
- 79 Hole Etched into the single mesa structure to allow oxidation to occur
- 80 solder electrically connecting the laser chip and the High speed electrical waveguide
- 81 Signal pad of the GSG electrical waveguide
- 82 P mirror
- 83 GSG Waveguide substrate
- 84 Plating shorting the N metal located on the N contact layer and the single ground mesa which is in electrical contact to the Ground Pad of the GSG electrical waveguide
- 85 Ground Pad of the GSG electrical waveguide Embodiment 10 for US Pat App Pub 2017/0033535

Figure 20:
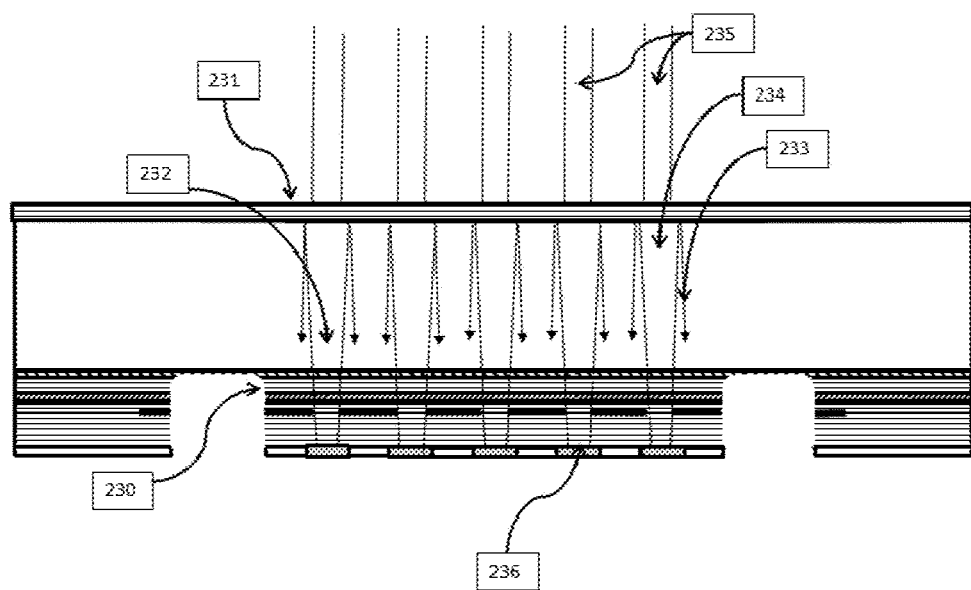
FIG. 20 shows a view of an example tenth embodiment.

FIG. 20 shows a tenth embodiment. FIG. 20 illustrates that an extended cavity laser design can be implemented using the single grid structure by reducing the reflectivity of the N epitaxial output mirror 230 to a point where it will not lase, then adding the reflectivity to a reflective surface 231 on the back of the lasing grid which extends the cavity. This structure reduces feedback of the higher mode structure 233 in the cavity, thereby forming a more fundamental mode structure for the output beam 235 from the grid. FIG. 20 shows:
- 230 Arrow pointing to incomplete N output mirror epitaxial region.
- 231 Reflective region made of dielectrically layers with varying indexes of refraction.
- 232 Cavity of laser beam now includes laser wafer material extending the cavity for modal rejection.
- 233 Reflected higher order modes which are not reflected back into the cavity
- 234 Single or lower order modes in the cavity
- 235 single or lower order modes outputted from the Extended Cavity Device Embodiment 11 for US Pat App Pub 2017/0033535

Figure 21:
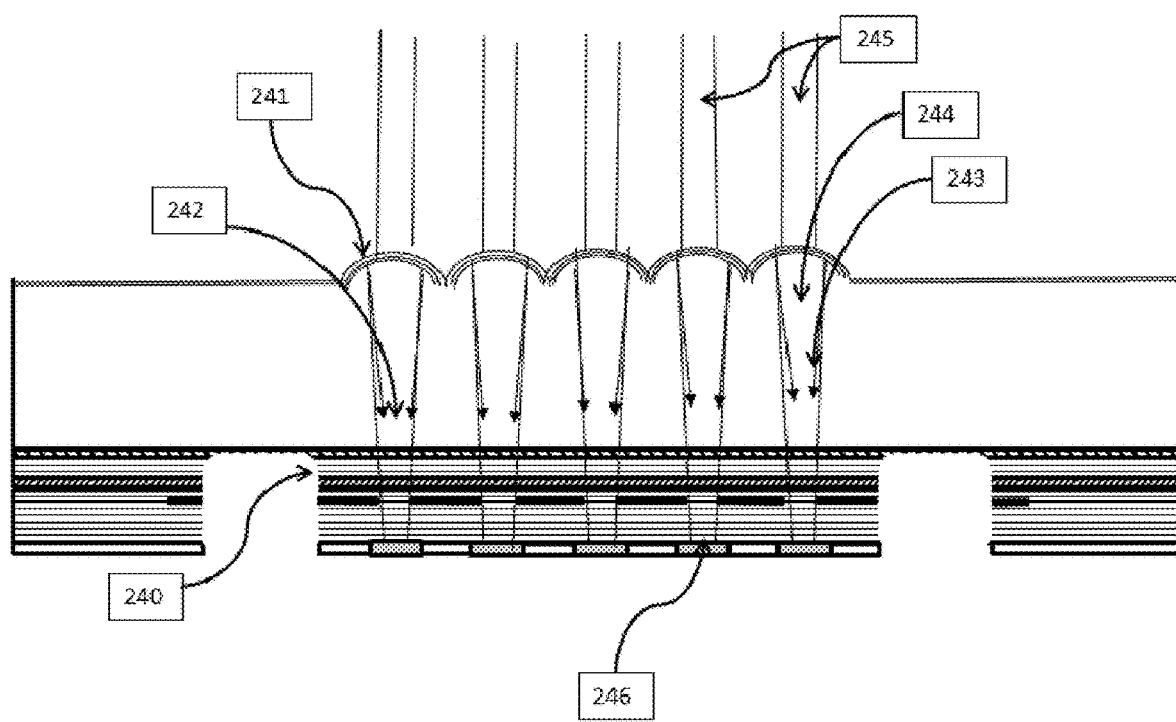
FIG. 21 shows a view of an example eleventh embodiment.

FIG. 21 shows an eleventh embodiment. In FIG. 21, a VCSEL structure can be adapted to the laser grid design like the above embodiment, and the back of the lasing chip where the output reflector (deposited on top of lens shape 241) of the lasing grid emits light can have convex 241 or concave features under the reflector to form better a focused (focus arrows 243) feedback mechanism which rejects high modes and can be designed to have a single mode lasing output 245 from each grid area. The overall lasing structure will then have low M2 values. A lens or microlens can be added to collimate the output. FIG. 21 shows:
- 240 Arrow pointing to incomplete N output mirror epitaxial region.
- 241 Reflective region made of dielectrically layers with varying indexes of refraction deposited on top of microlens structure etched into the laser substrate or wafer
- 242 Single mode beam being reflected within the extended cavity
- 243 light from edges being directed back into the single mode cavity from the optical element on the surface of the chip
- 244 single mode beam has more power and is more selective of the single mode than FIG. 20's single mode beam
- 245 Output of high quality single mode beams
- 246 highly reflective epitaxial mirror Embodiment 12 for US Pat App Pub 2017/0033535

Figure 22:
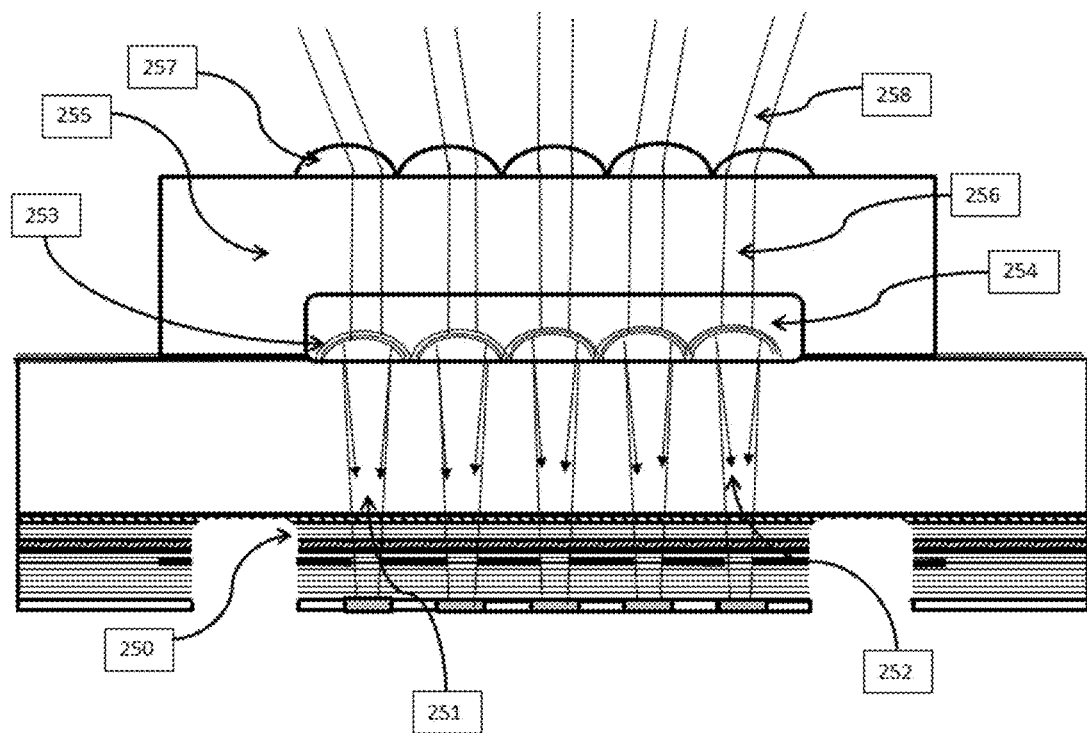
FIG. 22 shows a view of an example twelfth embodiment.

FIG. 22 shows a twelfth embodiment. In FIG. 22, a VCSEL structure can be adapted to the laser grid design like the above embodiment except that the beams which exit straight out of the lens go through an external microlens array which has been designed with different pitch microlens than the laser pitches to allow redirection of the beams either to or from a single location like many of the above embodiments. Other forms of this technique could use a concave lens formed on the bottom of the external lens array which are aligned and have the same pitch as the laser grid, while a convex laser array with a different pitch than the laser grid is at the top. Another technique to direct beams would be to use DOEs as the top optical element instead of the convex microlens which are on the top of the external lens array. 252 is light reflected back into the center of the aperture making a stronger single mode beam while 253 has the reflective coatings which complete the laser output mirror cavity. 254 is the cavity and would have an antireflective coating deposited on the inside of the external lens cavity while also depositing an anti-reflective coating on the top microlens array. Another technique would be to use the flat reflective properties such as in FIG. 20 to complete the cavity mirror and have the microlens array offset on the top or a DOE on top to redirect the beams. FIG. 22 shows:
- 250 Arrow pointing to incomplete N output mirror epitaxial region.
- 251 Single mode beam being reflected within the extended cavity
- 252 light from edges being directed back into the center creating strong single mode cavity from the optical element on the surface of the chip
- 253 Reflective region made of dielectrically layers with varying indexes of refraction deposited on top of microlens structure etched into the laser substrate or wafer
- 254 Cavity for etched lens to not touch external lens array
- 255 External lens array transmissive material
- 256 Single Mode beam outputted by extended cavity laser 257 Microlens from lens array with different pitch than laser pitch directing beams
258 Directed single mode beam.

What is claimed is:

1. An apparatus comprising:
a laser-emitting epitaxial structure having a front and a back, wherein the laser-emitting epitaxial structure is back-emitting and comprises a plurality of laser regions within a single mesa structure, each laser region having an aperture through which laser beams are controllably emitted;
a micro-lens array located behind the back of the laser-emitting epitaxial structure, wherein each micro-lens of the micro-lens array is aligned with a laser region of the laser-emitting epitaxial structure; and
a non-coherent beam combiner positioned to non-coherently combine a plurality of laser beams emitted from the apertures.

2. The apparatus of claim 1 wherein the micro-lens array is a photolithographic micro-lens array.

3. The apparatus of claim 1 wherein the micro-lens array comprises a plurality of graphene lens structures.

4. The apparatus of claim 1 wherein the non-coherent beam combiner comprises a two-dimensional (2D) non-coherent beam combiner with an overlapping convergence point.

5. The apparatus of claim 1 wherein the non-coherent beam combiner comprises a three-dimensional (3D) non-coherent beam combiner with a plurality of overlapping convergence points.

6. The apparatus of claim 1 further comprising:
an electrical waveguide configured to provide current to the laser regions.

7. The apparatus of claim 6 wherein each laser region is electrically isolated within the single mesa structure relative to the other laser regions of the single mesa structure.

8. The apparatus of claim 1 wherein the laser-emitting epitaxial structure comprises a vertical cavity surface emitting laser (VCSEL) epitaxial structure.

9. The apparatus of claim 1 wherein the laser-emitting epitaxial structure comprises a vertical extended cavity surface emitting laser (VECSEL) epitaxial structure.

10. The apparatus of claim 1 further comprising a plurality of the laser-emitting epitaxial structures and a plurality of the micro-lens arrays configured as a laser grid array.

11. The apparatus of claim 1 wherein the apparatus is configured to controllably emit laser beams from the laser regions as a drone defense, direct-energy weapon.

12. The apparatus of claim 1 further comprising a substrate having a front surface and a back surface;
wherein the laser-emitting epitaxial structure is located on the front surface of the substrate;
wherein the micro-lens array is located on the back surface of the substrate;
wherein the substrate comprises a plurality of laser cavities that are aligned with the laser regions of the laser-emitting epitaxial structure; and
wherein the laser beams that are back-emitted from the laser regions of the laser-emitting epitaxial structure pass through the laser cavities.

13. The apparatus of claim 12 wherein each laser cavity extends from the front surface of the substrate to the back surface of the substrate.

14. The apparatus of claim 13 wherein each of the laser cavities has an optical axis for laser beam emissions, wherein the optical axes are perpendicular to the back of the laser-emitting epitaxial structure.

15. The apparatus of claim 13 wherein the micro-lenses are covered with reflective coatings to reflect laser light from the emitted laser beams back through the laser cavity.

16. The apparatus of claim 15 wherein the micro-lenses have a smooth radius of curvature so that the reflected laser light is concentrated to a center of the laser cavities.

17. The apparatus of claim 12 further comprising a stack of laser arrays, wherein each laser array in the stack comprises its own instance of (1) the laser-emitting epitaxial structure with a grid of the laser regions, (2) the substrate, and (3) the micro-lens array, and wherein each laser array in the stack higher than a bottom of the stack is configured to direct the laser beams from its own laser regions and a cone of laser beams from one or more lower laser arrays in the stack so as to combine laser beams from multiple laser arrays for a concentrated projection of laser light to the non-coherent beam combiner.

18. The apparatus of claim 17 wherein each laser array in the stack higher than the bottom of the stack and lower than a top of the stack includes a concentrating lens that is positioned to receive and direct the laser beam cone from one or more lower laser arrays in the stack onto the concentrating lens of a next higher laser array in the stack, and wherein the grids of laser regions in the laser arrays in the stack that are higher than the bottom of the stack and lower than the top of the stack are positioned around the concentrating lenses.

19. The apparatus of claim 18 wherein the concentrating lenses comprise torus-shaped lenses, wherein the torus-shaped lenses are positioned in alignment with a central axis of the stack.

20. The apparatus of claim 18 wherein the micro-lens array of the laser array at the bottom of the stack is configured to direct the laser beams from the laser regions of that laser array as a cone of laser beams onto the concentrating lens of the laser array that is first from the bottom in the stack;
wherein the concentrating lens of the first from the bottom laser array is configured to receive and direct the laser beam cone from the bottom laser array onto the concentrating lens of a laser array that is second from the bottom in the stack, and wherein the micro-lens array of the first from the bottom laser array is configured to direct the laser beams from the laser regions of the first from the bottom laser array as a cone of laser beams onto the concentrating lens of the second from the bottom laser array; and
wherein the concentrating lens of the second from the bottom laser array is configured to receive and direct the laser beam cone from the first from the bottom laser array to a location higher in the stack, and wherein the micro-lens array of the second from the bottom laser array is configured to direct the laser beams from the laser regions of the second from the bottom laser array as a cone of laser beams in combination with the laser beam cone directed from the concentrating lens of the second from the bottom laser array.

21. A method comprising:
generating a plurality of laser beams by selectively applying current to a laser-emitting epitaxial structure having a front and a back, wherein the laser-emitting epitaxial structure is back-emitting and comprises a plurality of laser regions within a single mesa structure, each laser region having an aperture through which the laser beams are emitted;
directing the generated laser beams to a micro-lens array located behind the back of the laser-emitting epitaxial structure, wherein each micro-lens of the micro-lens array is aligned with a laser region of the laser-emitting epitaxial structure; and non-coherently combining the laser beams emitted from the apertures.

22. The method of claim 21 wherein the micro-lens array is a photolithographic micro-lens array.

23. The method of claim 21 wherein the micro-lens array comprises a plurality of graphene lens structures.

24. The method of claim 21 wherein the non-coherently combining comprises performing two-dimensional (2D) non-coherent beam combining with an overlapping convergence point.

25. The method of claim 21 wherein the non-coherently combining comprises performing three-dimensional (3D) non-coherent beam combining with a plurality of overlapping convergence points.

26. The method of claim 21 further comprising:
applying the current to the laser-emitting epitaxial structure via an electrical waveguide.

27. The method of claim 26 wherein each laser region is electrically isolated within the single mesa structure relative to the other laser regions of the single mesa structure.

28. The method of claim 21 wherein the laser-emitting epitaxial structure comprises a vertical cavity surface emitting laser (VCSEL) epitaxial structure.

29. The method of claim 21 wherein the laser-emitting epitaxial structure comprises a vertical extended cavity surface emitting laser (VECSEL) epitaxial structure.

30. The method of claim 21 further comprising a plurality of the laser-emitting epitaxial structures and a plurality of the micro-lens arrays configured as a laser grid array.

31. The method of claim 21 wherein the combined laser beams serve as a drone defense, direct-energy weapon.

32. The method of claim 21 wherein a substrate is located on the back of the laser-emitting epitaxial structure, the substrate having a front surface and a back surface;

wherein the laser-emitting epitaxial structure is located on the front surface of the substrate;

wherein the micro-lens array is located on the back surface of the substrate;

wherein the substrate comprises a plurality of laser cavities that are aligned with the laser regions of the laser-emitting epitaxial structure; and wherein the directing step includes passing the laser beams that are back-emitted from the laser regions of the laser-emitting epitaxial structure through the laser cavities.

33. The method of claim 32 wherein each laser cavity extends from the front surface of the substrate to the back surface of the substrate.

34. The method of claim 33 wherein each of the laser cavities has an optical axis for laser beam emissions, wherein the optical axes are perpendicular to the back of the laser-emitting epitaxial structure.

35. The method of claim 33 further comprising:
reflecting laser light from the emitted laser beams back through the laser cavities via reflective coatings that cover the micro-lenses of the micro-lens array.

36. The method of claim 35 wherein the micro-lenses have a smooth radius of curvature so that the reflected laser light is concentrated to a center of the laser cavities.

37. The method of claim 32 wherein the method is performed with respect to a stack of laser arrays, wherein each laser array in the stack comprises its own instance of (1) the laser-emitting epitaxial structure with a grid of the laser regions, (2) the substrate, and (3) the micro-lens array; and the method further comprising each laser array in the stack higher than a bottom of the stack directs the laser beams from its own laser regions and a cone of laser beams from one or more lower laser arrays in the stack so as to combine laser beams from multiple laser arrays for a concentrated projection of laser light to the non-coherent beam combiner.

38. The method of claim 37 wherein each laser array in the stack higher than the bottom of the stack and lower than a top of the stack includes a concentrating lens that is positioned to receive and direct the laser beam cone from one or more lower laser arrays in the stack onto the concentrating lens of a next higher laser array in the stack, and wherein the grids of laser regions in the laser arrays in the stack higher than the bottom of the stack and lower than the top of the stack are positioned around the concentrating lenses.

39. The method of claim 38 wherein the concentrating lenses comprise torus-shaped lenses, wherein the torus-shaped lenses are positioned in alignment with a central axis of the stack.

40. The method of claim 38 wherein the micro-lens array of the laser array at the bottom of the stack is directs the laser beams from the laser regions of that laser array as a cone of laser beams onto the concentrating lens of the laser array that is first from the bottom in the stack;

wherein the concentrating lens of the first from the bottom laser array receives and directs the laser beam cone from the bottom laser array onto the concentrating lens of a laser array that is second from the bottom in the stack, and wherein the micro-lens array of the first from the bottom laser array directs the laser beams from the laser regions of the first from the bottom laser array as a cone of laser beams onto the concentrating lens of the second from the bottom laser array; and wherein the concentrating lens of the second from the bottom laser array receives and directs the laser beam cone from the first from the bottom laser array to a location higher in the stack, and wherein the micro-lens array of the second from the bottom laser array directs the laser beams from the laser regions of the second from the bottom laser array as a cone of laser beams in combination with the laser beam cone directed from the concentrating lens of the second from the bottom laser array.

* * * * *